(12) United States Patent
Kuroda et al.

(10) Patent No.: US 8,426,969 B2
(45) Date of Patent: Apr. 23, 2013

(54) SEMICONDUCTOR DEVICE HAVING ACTIVE REGION AND DUMMY WIRINGS

(75) Inventors: Kenichi Kuroda, Tachikawa (JP); Kozo Watanabe, Kokubunji (JP); Hirohiko Yamamoto, Hachioji (JP)

(73) Assignees: Renesas Electronics Corporation, Kanagawa (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 13/362,385

(22) Filed: Jan. 31, 2012

(65) Prior Publication Data

US 2012/0126360 A1  May 24, 2012

Related U.S. Application Data

(60) Continuation of application No. 13/096,246, filed on Apr. 28, 2011, now Pat. No. 8,119,495, which is a continuation of application No. 12/714,596, filed on Mar. 1, 2010, now Pat. No. 7,948,086, which is a continuation of application No. 11/978,686, filed on Oct. 30, 2007, now Pat. No. 7,687,914, which is a continuation of application No. 11/430,983, filed on May 10, 2006, now Pat. No. 7,411,302, which is a continuation of application No. 10/748,139, filed on Dec. 31, 2003, now Pat. No. 7,071,560, which is a division of application No. 09/985,309, filed on Nov. 2, 2001, now Pat. No. 6,693,315.

(30) Foreign Application Priority Data

Nov. 20, 2000 (JP) .............................. 2000-353045

(51) Int. Cl.
   *H01L 23/48* (2006.01)
(52) U.S. Cl.
   USPC ........................................... 257/758
(58) Field of Classification Search .............. 257/758, 257/E23.141
   See application file for complete search history.

(56) References Cited

U.S. PATENT DOCUMENTS

| 4,755,482 A | 7/1988 | Nagakubo |
| 5,569,941 A | 10/1996 | Takahashi |
| 5,885,856 A | 3/1999 | Gilbert et al. |
| 5,900,655 A | 5/1999 | Shim |
| 5,924,006 A | 7/1999 | Lur et al. |

(Continued)

FOREIGN PATENT DOCUMENTS

| JP | 06-120488 | 4/1994 |
| JP | H9-306996 | 11/1997 |
| JP | 10-092921 | 4/1998 |
| JP | 2000-114258 | 4/2000 |
| JP | 2000-286263 | 10/2000 |
| JP | 2001-144171 | 5/2001 |
| JP | 2001-176959 | 6/2001 |

*Primary Examiner* — William D Coleman
(74) *Attorney, Agent, or Firm* — Antonelli, Terry, Stout & Kraus, LLP.

(57) ABSTRACT

There is provided a technique for improving the flatness at the surface of members embedded in a plurality of recesses without resulting in an increase in the time required for the manufacturing processes. According to this technique, the dummy patterns can be placed up to the area near the boundary BL between the element forming region DA and dummy region FA by placing the first dummy pattern $DP_1$ of relatively wider area and the second dummy pattern $DP_2$ of relatively small area in the dummy region FA. Thereby, the flatness of the surface of the silicon oxide film embedded within the isolation groove can be improved over the entire part of the dummy region FA. Moreover, an increase of the mask data can be controlled when the first dummy patterns $DP_1$ occupy a relatively wide region among the dummy region FA.

7 Claims, 16 Drawing Sheets

U.S. PATENT DOCUMENTS

| | | |
|---|---|---|
| 5,970,238 A | 10/1999 | Shibata et al. |
| 6,153,918 A | 11/2000 | Kawashima et al. |
| 6,225,697 B1 | 5/2001 | Iguchi |
| 6,261,883 B1 | 7/2001 | Koubuchi et al. |
| 6,335,560 B1 | 1/2002 | Takeuchi |
| 6,433,438 B2 | 8/2002 | Koubuchi et al. |
| 6,495,855 B1 | 12/2002 | Sawamura |
| 6,521,969 B1 | 2/2003 | Tomita |
| 6,603,162 B1 | 8/2003 | Uchiyama et al. |

SEMICONDUCTOR DEVICE HAVING ACTIVE REGION AND DUMMY WIRINGS

This application is a continuation of U.S. application Ser. No. 13/096,246, filed Apr. 28, 2011, now U.S. Pat. No. 8,119,495 which, in turn, is a continuation of U.S. application Ser. No. 12/714,596, filed Mar. 1, 2010, now U.S. Pat. No. 7,948,086, which, in turn, is a continuation of U.S. application Ser. No. 11/978,686, filed Oct. 30, 2007, now U.S. Pat. No. 7,687,914, which, in turn, is a continuation of U.S. application Ser. No. 11/430,983, filed May 10, 2006, now U.S. Pat. No. 7,411,302, which, in turn, is a continuation of U.S. application Ser. No. 10/748,139, filed Dec. 31, 2003 now U.S. Pat. No. 7,071,560, and now U.S. Pat. No. 7,071,560, and which, in turn, is a divisional of U.S. application Ser. No. 09/985,309, filed Nov. 2, 2001, and now U.S. Pat. No. 6,693,315; and the entire disclosures of which are incorporated herein by reference.

BACKGROUND OF THE INVENTION

The present invention relates to a semiconductor device and to a method of manufacturing the same; and, more particularly, the invention relates to a technique that can effectively be applied to the manufacture of a semiconductor device, including a flattening process utilizing a CMP (Chemical Mechanical Polishing) method.

Trench isolation is one of the isolation methods employed for electrically isolating adjacent semiconductor elements. In a typical trench isolation fabrication process, grooves are provided on a semiconductor substrate, which grooves become an element isolation region, and these grooves are filled with insulation films.

Trench isolation is formed, for example, using the following method. First, grooves are formed to a depth, for example, of about 0.4 µm in the element isolation region of the semiconductor substrate using a dry etching method; and, thereafter, a first insulation film is formed to a thickness, for example, of about 20 nm at the surface where the semiconductor substrate is exposed by carrying out a thermal oxidation process on the semiconductor substrate. Thereafter, a second insulation film is deposited on the semiconductor substrate to fill the inside of the grooves; and, then, the trench isolation is formed by removing the portion of the second insulation film at the outside side of the grooves and leaving the portion of the second insulation film only inside of the grooves, through polishing of the surface of this second insulation film, for example, using the CMP method.

When the width of the element isolation region becomes relatively large, the polishing rate of the second insulation film becomes high in the local area during the CMP process, and, thereby, a so-called dishing phenomenon is easily generated, whereby a "recess" is produced at the central area of the grooves. However, several methods have been proposed to improve the flatness at the surface of the second insulation film in the element isolation region by controlling the dishing phenomenon. A method of providing a dummy pattern is one of such methods.

For example, the Japanese Patent Application Laid-Open No. Hei 10(1998)-92921, corresponding to the U.S. Pat. No. 5,885,856, discloses a method in which each dummy structure is placed in a non-active device area to cause the occupation density in the non-active device area to be equal to that of the active device area, and, thereby, the polishing rate is equalized for the entire part of the semiconductor substrate surface.

Moreover, the inventors of the present invention have considered a method of placing the dummy patterns in a regular manner. The technique explained below has been considered by the inventors of the present invention and its outline is as follows.

FIG. 28 shows a first dummy pattern placing method which the inventors of the present invention have considered.

A plurality of dummy patterns $DPA_1$ are regularly placed in a dummy region (region outside of the frame indicated by the broken line in the figure) FA, where semiconductor elements are not formed, outside of the element forming region (region within the frame of broken line in the figure) DA, where the semiconductor elements are formed. A plurality of dummy patterns $DPA_1$ are formed to be equal in shape and size, and these dummy patterns are extensively placed with the same interval in the dummy region FA.

The element forming region DA and dummy region FA, outside of the active region AC, form element isolation region IS, and a trench isolation is usually formed in the entire part of this isolation region IS. Therefore, this method for regularly placing the dummy patterns has the inherent problem that the dishing phenomenon is easily generated during the CMP process, particularly in the dummy region FA, which is isolated from the active region AC. However, it is now possible to prevent such dishing phenomenon in the dummy region FA by placing a plurality of dummy patterns $DP_1$ therein, whereby the flatness at the surface of the embedding insulation film in the dummy region FA can be improved.

FIG. 29 shows a second dummy pattern placing method which the inventors of the present invention have discussed. Like the method illustrated in FIG. 28, a plurality of dummy patterns $DPA_2$ are regularly placed in the dummy region FA, where the semiconductor elements are not formed, outside of the element forming region DA, where the semiconductor elements are formed, and, thereby, the dishing in the dummy region FA can be prevented. The size of the dummy patterns $DPA_2$ is smaller than the size of the dummy patterns $DPA_1$ and the dummy patterns $DPA_2$ can be placed up to the dummy region FA near the boundary BL (indicated by the frame line in the figure) between the element forming region DA and dummy region FA.

SUMMARY OF THE INVENTION

However, according to an investigation by the inventors of the present invention, there has been a further problem in that, when the dummy structures are placed in the non-active device area, some dummy structures are complicated in shape and the insulation film is not perfectly embedded within the internal side of the dummy structures which are particularly defined. Moreover, it has also been formed that the time required for the manufacturing process is extended because it is necessary to additionally provide a process for removing the dummy structures that are too small to be formed.

In addition, the inventors of the present invention have also found that the following problem exists in the first dummy pattern placing method and the second dummy pattern placing method.

In the first dummy pattern placing method, since the size of the dummy patterns $DPA_1$ is relatively large, a region where the dummy patterns $DPA_1$ cannot be placed is generated in the dummy region FA near the boundary BL between the element forming region DA and dummy region FA; and, if this region is extended relatively, it is apparent that the dishing phenomenon is generated.

In the second dummy pattern placing method, since the size of the dummy patterns $DPA_2$ is relatively small, the dummy patterns $DPA_2$ may be placed up to the area near the boundary BL between the element forming region DA and dummy region FA. Thereby, since the dummy patterns $DPA_2$ may be placed also in the region where the dummy patterns $DPA_1$ cannot be placed, the second dummy pattern placing method can further improve the flatness of the surface of the embedded insulation film up to the dummy region FA near the boundary BL in comparison with the first dummy pattern placing method.

However, when the second dummy pattern placing method is introduced, the number of dummy patterns $DPA_2$ placed in the dummy region FA increases, and, thereby, the coordinate data required for generating a mask remarkably increases. As a result, there arises a problem in that the arithmetic processing time in computer used for generating a mask pattern increases, and, moreover, the time required for drawing the patterns on the mask substrate also increases, with the result that the throughput in the formation of a mask is remarkably deteriorated. Particularly, when the second dummy pattern placing method is employed for ASIC (Application Specific Integrated Circuit: integrated circuit for particular application), the time required to generate the mask is extended, with the result that a problem remains for development of ASIC within a short period of time.

It is therefore an object of the present invention to provide a technique to improve the flatness of the surface of members embedded in a plurality of recesses.

It is another object of the present invention to provide a technique to improve the flatness of the surface of members embedded in a plurality of recesses without extension of the time required for manufacturing the semiconductor device.

The objects explained above, other objects and novel features of the present invention will become more apparent from the following description of the present invention and the accompanying drawings.

The typical aspects of the invention disclosed in the present application will be briefly explained below.

(1) In the semiconductor device of the present invention, there are provided an element forming region where circuit elements are specified with the boundary and a dummy region where circuit elements adjacent to the boundary are not formed. The dummy region has at least two dummy pattern groups, each dummy pattern group allocates a plurality of dummy patterns in the same occupation shape on the plane and in the same size with isolation like a matrix, while maintaining also an equal interval between the patterns, and the sizes of a plurality of dummy patterns in the row direction and/or column direction are different among the dummy pattern groups.

(2) A method of manufacturing a semiconductor device of the present invention relates to a semiconductor device in which an element forming region where circuit elements are formed and a dummy region where circuit elements are not formed are specified with a boundary, and at least two dummy pattern groups are formed in the dummy region. The method comprises a process to form a first isolation groove for specifying an active region of the element forming region on the main surface of a semiconductor substrate and a second isolation groove for dividing, in a matrix shape, a plurality of dummy patterns forming a dummy pattern group in the dummy region; a process to deposit an insulation film covering the element forming region and dummy region so as to embed the first isolation groove and second isolation groove; and a process to remove the insulation film at the outside of the first isolation groove and second isolation groove by polishing the surface of insulation film, whereby a plurality of dummy patterns having the same occupation shape on the plane and the same size are formed in each dummy pattern group, but the sizes of dummy patterns in the row direction and/or column direction are different among the dummy pattern groups.

(3) A method of designing a semiconductor device of the present invention relates to a semiconductor device having an element forming region, where circuit elements are specified with a boundary, and a dummy region, where circuit elements are provided adjacent to the boundary. The dummy region has at least two dummy pattern groups, and a plurality of dummy patterns having the same occupation shape on the plane and the same size are disposed in a spaced arrangement like a matrix shape in each dummy pattern group and the sizes of a plurality of dummy patterns in the row direction and/or column direction are different among the dummy pattern groups. The method comprises a process to allocate, after specifying the element forming region and dummy region using the boundary, a plurality of dummy patterns for each dummy pattern group to generate a mesh of a size adding a size of one side of the dummy pattern forming the dummy pattern group and a size of the space among the adjacent dummy patterns for each dummy pattern group and allocate the dummy patterns within the mesh in the region where placement of dummy patterns is prohibited.

According to the features explained above, a plurality of dummy patterns can be placed up to the area near the boundary between the element forming region and dummy region. Thereby, the flatness of the surface of the insulation film embedded in the isolation grooves can be improved over the entire area of the dummy region.

Moreover, since a relatively wide region in the dummy region can be occupied by a plurality of dummy patterns of relatively wider area, while the remaining relatively narrow region can be occupied with a plurality of dummy patterns of relatively narrow area, an increase in the number of dummy patterns can be controlled. Therefore, an increase in the amount of coordinate data which needs to be produced at the time of generating a mask can also be controlled with a view toward controlling an increase in the arithmetic processing time of a computer used for such processing and the time for drawing a pattern on the mask substrate.

DESCRIPTION OF THE PREFERRED EMBODIMENTS

Figure 1:
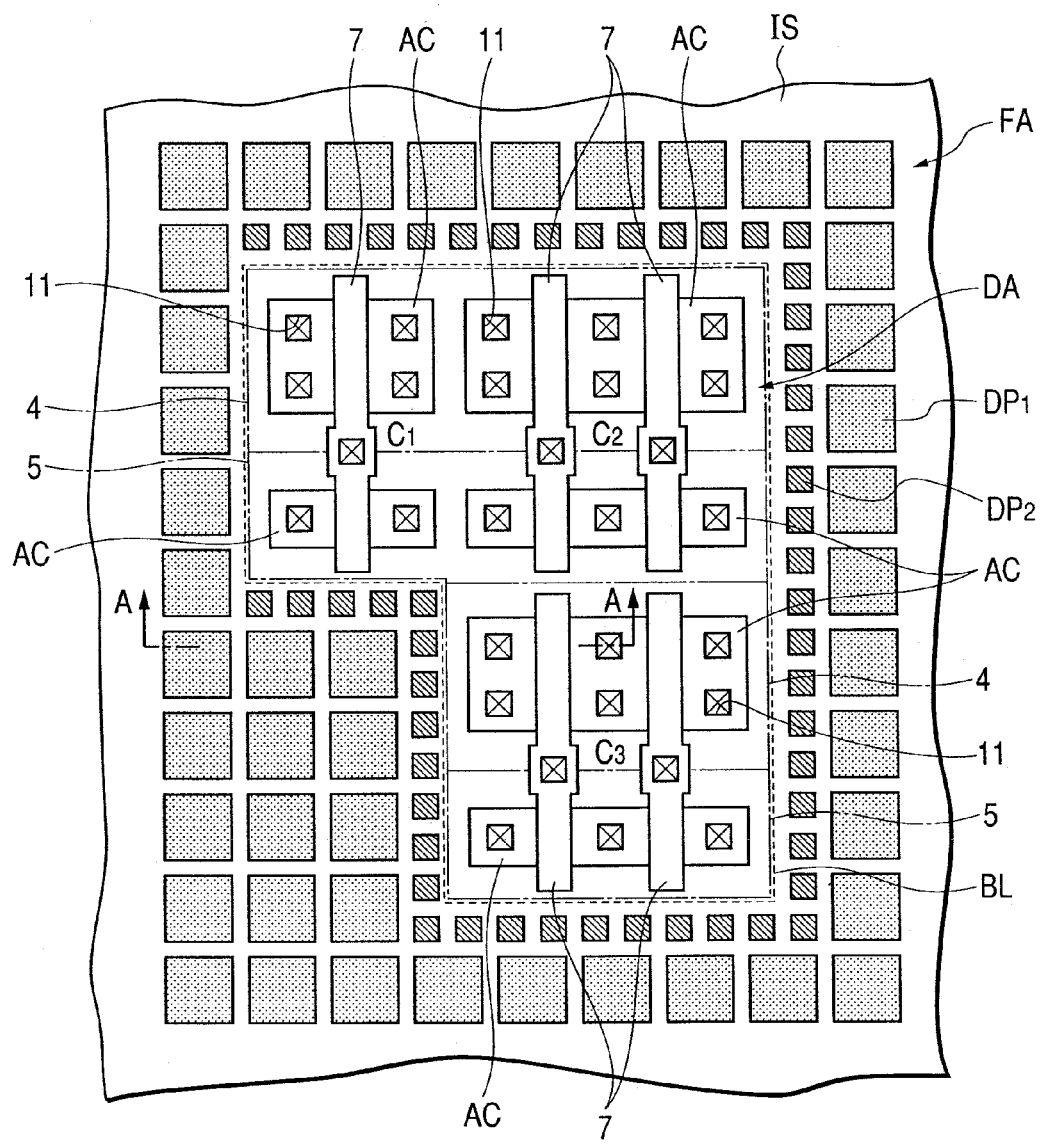
FIG. 1 is a plan view of a portion of a logic integrated circuit device representing an embodiment 1 of the present invention.

The preferred embodiments of the present invention will be explained in detail with reference to the accompanying drawings. In the following explanation of the preferred embodiments, like elements are designated with like reference numerals throughout the accompanying drawings, and an explanation thereof is not repeated.

In regard to the term "shape" as used in the description of the present invention, the expression of shape, such as "square shape" and "rectangular shape", includes the shape according to a design concept, the shape of a mask pattern according to the data, the shape on the mask and the shape of a real pattern on the patterned integrated circuit device, and this term also substantially includes a shape where corners are a little deformed from the true geographical shape, due to problems in a given process, such as lithography.

(Embodiment 1)

Figure 2:
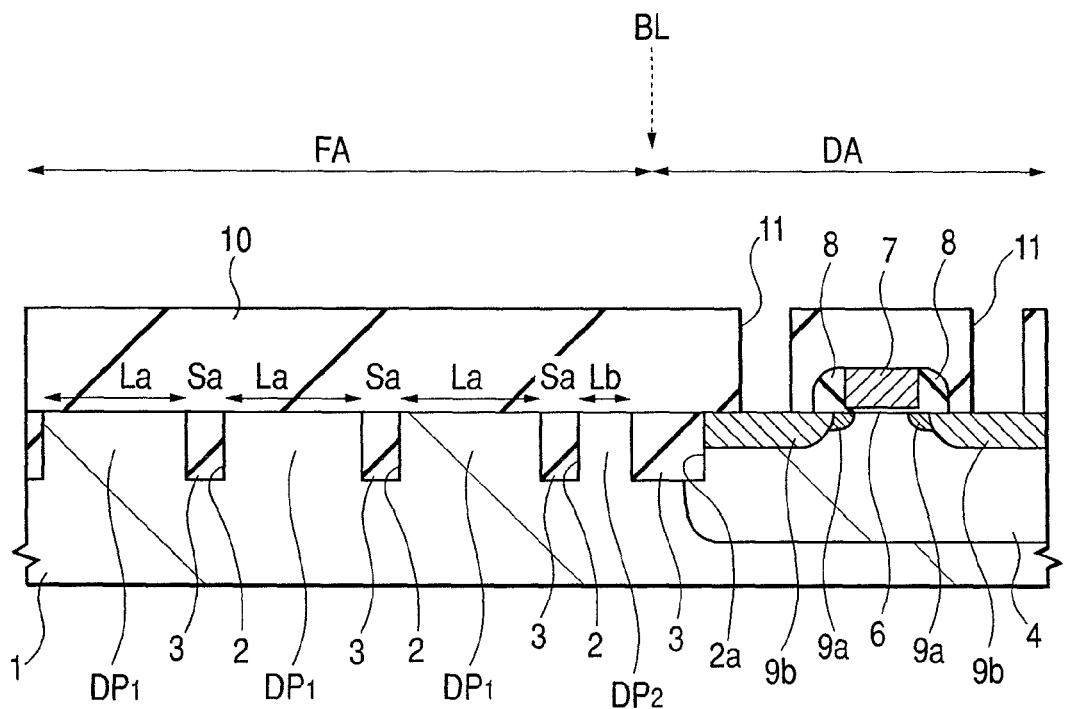
FIG. 2 is a cross-sectional view along the line A-A of FIG. 1.
Figure 3A:
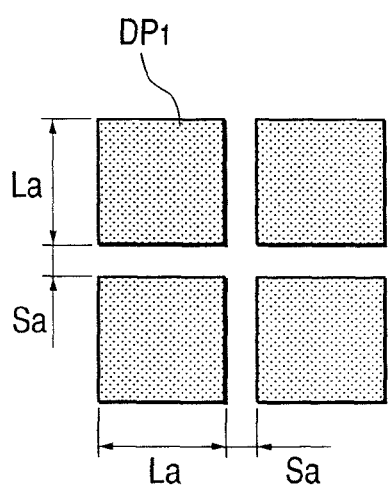
FIGS. 3(a) and 3(b) are diagrammatic plan views illustrating examples of a pitch and a size of dummy patterns.
Figure 3B:
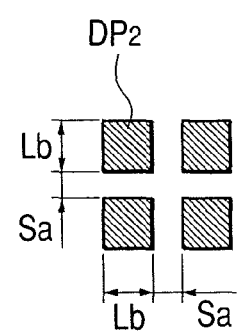
Figure 4:
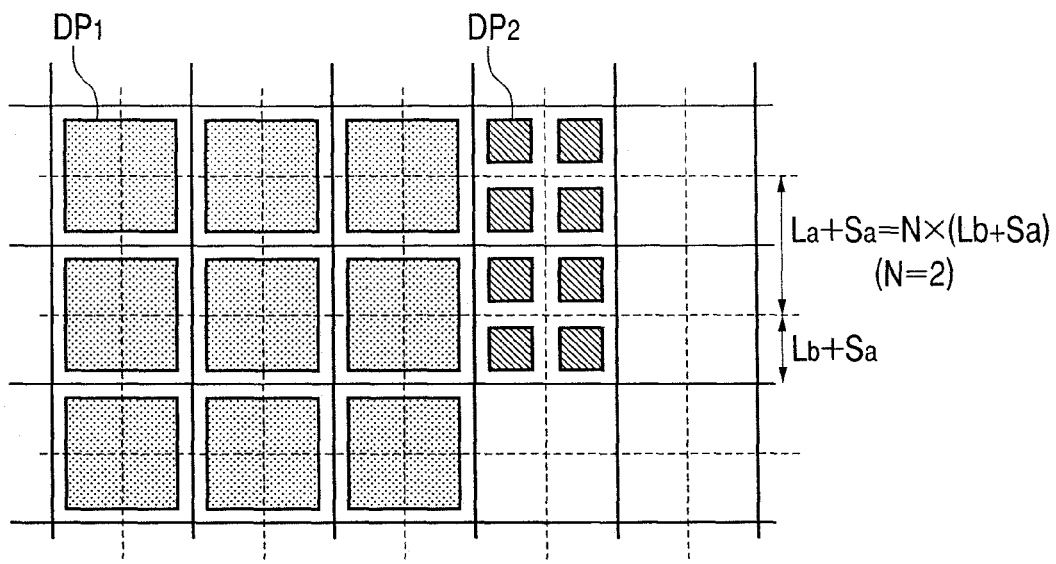
FIG. 4 is a diagrammatic plan view illustrating an example of the placement of the dummy patterns.
Figure 5:
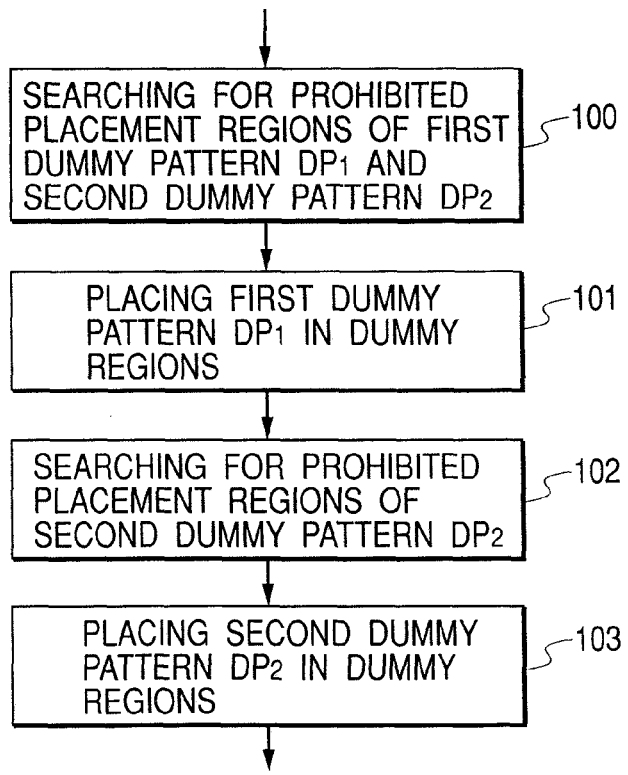
FIG. 5 is a process flow diagram showing an example of a pattern manufacturing method.

An example of the placement of dummy patterns according to embodiment 1 of the present invention will be explained with reference to FIG. 1 to FIG. 5. FIG. 1 is a plan view of an example of a logic integrated circuit device. FIG. 2 is a cross-sectional view taken along the line A-A of FIG. 1. FIGS. 3(a) and 3(b) are plan views showing a pitch and a size of the dummy patterns. FIG. 4 is a plan view showing an example of the placement of the dummy patterns. FIG. 5 is a process flow diagram showing an example of a method of generating the dummy patterns.

As shown in FIG. 1, the area inside of the boundary BL, which is indicated by a broken line, represents the element forming region DA where semiconductor elements are formed, while the area outside of the boundary BL represents the dummy region FA where semiconductor elements are not formed.

The boundary BL between the element forming region DA and dummy region FA is determined from a layout of the conductive film existing on the element isolation region IS and a layout of the active regions AC. Since a problem, such as increase in the capacitance load, is generated when a dummy pattern is formed beneath the conductive film, it is necessary to determine the location of the boundary BL in such a way as to ensure that the conductive film and the dummy patterns do not overlap. In the embodiment 1 of the present invention, the boundary BL is determined, in consideration of the allowable size required for reduction of such a capacitance load and the aligning accuracy available in the lithography process, on the basis of the layout of the conductive film and the layout of the active regions AC extending on the element isolation region IS.

As shown in FIG. 1 and FIG. 2, the CMOSFETs (Complementary Metal Oxide Semiconductor Field Effect Transistors) $C_1$, $C_2$, $C_3$ are formed in the element forming region DA. An active region AC is specified with respect to the element isolation region IS where the silicon oxide film 3 is embedded in the isolation grooves 2a formed on the main surface of the semiconductor substrate 1.

On the main surface of semiconductor substrate 1, a p-type well 4 and an n-type well 5 are formed, and an n-channel MISFET (Metal Insulator Semiconductor FET) is formed in the p-type well 4, while a p-channel MISFET is formed in the n-type well 5. On the main surface of the semiconductor substrate 1, a gate electrode 7 is formed via a gate insulation film 6 of the n-channel MISFET and p-channel MISFET. The gate insulation film 6 may be formed of a silicon oxide film, for example, using the thermal oxidation method, and the gate electrode 7 may be formed of a polycrystalline silicon film, for example, using the CVD (Chemical Vapor Deposition) method. At the surface of the polycrystalline silicon film, a silicide layer for reduction of electric resistance may be formed. Moreover, the gate electrode 7 is formed to extend on the element isolation region IS from the active region AC.

A side wall spacer 8 is formed at the side walls of the gate electrode 7 of the n-channel MISFET and p-channel MISFET. This side wall spacer 8 may be formed, for example, of a silicon oxide film or a silicon nitride film. Moreover, the source and drain expanding regions 9a are formed to sandwich a channel region in the p-type wells 4 on both sides of the gate electrode 7 of the n-channel MISFET; and, moreover, the source and drain expanding regions 9b are formed at the external side of the source and drain expanding regions 9a. In the same manner, although not shown particularly, the source and drain expanding regions are formed to sandwich the channel region in the n-type wells 5 on both sides of the gate electrode 7 of the p-channel MISFET; and, moreover, the source and drain diffusing regions are formed at the outside of the source and drain expanding regions. The source and drain of the n-channel MISFET and p-channel MISFET are formed to have a so-called LDD (Lightly Doped Drain) structure.

The CMOSFETs $C_1$, $C_2$, $C_3$ formed in the element forming region DA are covered with an interlayer insulation film 10, which is provided with the p-type well and n-type well of the active region AC and a contact hole 11 reaching the gate electrode. The interlayer insulation film 10 is formed, for example, of a silicon oxide film, and the surface thereof is preferably flattened using the etch back method or CMP method. On the interlayer insulation film 10, wirings are formed, but these wirings are not shown.

In the dummy region FA, a plurality of the first dummy patterns DP1 of relatively large area (indicated as the stippled areas in FIG. 1) and a plurality of the second dummy patterns DP2 of relatively narrow area (indicated as the hatched areas in FIG. 1) are regularly placed. As shown in FIG. 3(a), the first dummy pattern $DP_1$ has a side size of La in both row and column directions and is structured as a square semiconductor island corresponding to the active region AC, occupying a relatively wide region in the dummy region FA. On the other hand, the second dummy pattern $DP_2$ has a side size of Lb in both row and column directions and is structured as a square semiconductor island corresponding to the active region AC and is placed in a relatively narrow region in the dummy region FA.

Here, the size La of one side of the first dummy pattern $DP_1$ is set to be larger than the size Lb of one side of the second dummy pattern $DP_2$, but the size of the space between adjacent first dummy patterns $DP_1$ and the size of the space between adjacent second dummy patterns $DP_2$ are set to be equal to the size of the space Sa, and the first dummy patterns $DP_1$ and the second dummy patterns $DP_2$ are respectively isolated with an identical spacing.

Moreover, as shown in FIG. 4, the pattern size, which is equal to the size La of a side of the first dummy pattern $DP_1$+the space size Sa, is equal in both row and column directions to an integer times the pattern size which is equal to the size Lb of a side of the second dummy pattern $DP_2$+the space size Sa, satisfying the relationship of La+Sa=NX (Lb+Sa) (N is an integer 1 or larger, N≧1). Thereby, since the first dummy pattern $DP_1$ and second dummy pattern $DP_2$, which have different sizes, can be regularly placed in a plural number in the dummy region FA, an increase in the arithmetic processing time of a computer can be controlled even when the coordinate data for generating a mask increases.

Moreover, the sizes La of the first dummy pattern $DP_1$, Lb of the second dummy patterns $DP_2$ and the space size Sa are set to the minimum allowable size (minimum size allowable for pattern design) or more. If these sizes become smaller than the minimum allowable size, various problems, such as peeling of the resist pattern, manufacturing failure of isolation grooves in the thy-etching process or embedding failure of the silicon oxide film into the isolation grooves are generated at the time of forming the element isolation region IS. For example, the size La of a side of the first dummy pattern DP1 is set to 2.0 µm, while the size Lb of a side of the second dummy pattern $DP_2$ is set to 0.8 µm and the space size Sa is set to 0.4 µm.

Next, the dummy pattern placement method will be explained with reference to FIG. 5. The placement data for the dummy pattern is generated using an automatic program installed in a computer. Next, a dummy pattern is drawn on the mask substrate on the basis of this placement data, and the dummy pattern is then transferred to a semiconductor substrate via the mask. Here, the method of generating the placement data of the first dummy pattern $DP_1$ and second dummy pattern $DP_2$ using the automatic program will be explained.

First, the placement prohibiting region of the first and second dummy patterns $DP_1$ and $DP_2$ (element forming region DA) is obtained (process 100 of FIG. 5). As explained above, the placement prohibiting region is determined, in consideration of the allowable size required for reduction of capacitance load and aligning accuracy in the lithography technique, based on the layout of the conductive film extending on the element isolation region IS and the layout of the active region AC. Namely, the specified size data is respectively added to the coordinate data of the conductive film extending on the element isolation region IS and the coordinate data of the active region AC, and the coordinate data of the placement prohibiting region can be obtained by obtaining the OR logic of all data obtained. For example, the region isolated by 2 µm from the active region AC, where the CMOSFETs $C_1$, $C_2$, $C_3$ are formed, is designated as the first placement prohibiting region, the region isolated by 1 µm from the gate electrodes of the CMOSFETs $C_1$, $C_2$, $C_3$ is designated as the second placement prohibiting region and the OR region between the first and second placement prohibiting regions is designated as the placement prohibiting region of the first and second dummy patterns $DP_1$ and $DP_2$.

Next, the first dummy patterns $DP_1$ of relatively large area are placed in the greater part of the dummy region FA (process 101 of FIG. 5). For example, after a mesh is formed in the first pitch on the entire surface of the semiconductor substrate 1, the mesh of the placement prohibiting region of the first and second dummy patterns $DP_1$ and $DP_2$ is removed. Otherwise, after the mesh is formed in the first pitch on the entire surface of the semiconductor substrate 1, the mesh of the placement prohibiting region of the first and second dummy patterns $DP_1$ and $DP_2$ is removed, and, moreover, the mesh of the minimum allowable size or less is removed. Thereafter, the first dummy pattern $DP_1$ is placed in the mesh. Here, the first pitch is a pattern size (La+Sa) which is equal to the size La of a side of the first dummy pattern $DP_1$+the space size Sa.

Next, the placement prohibiting region of the second dummy pattern $DP_2$ of relatively smaller area is obtained (process 102 of FIG. 5). The placement prohibiting region of the second dummy pattern $DP_2$ is designated by adding the region where the first dummy patterns $DP_1$ are placed extensively in the process 101 to the placement prohibiting region of the second dummy pattern $DP_2$.

Next, the second dummy patterns DP2 of relatively smaller area are placed in the dummy region FA (process 103 of FIG. 5). For example, after the mesh is generated in the second pitch on the entire surface of the semiconductor substrate 1, the mesh of the placement prohibiting region of the second dummy pattern $DP_2$ is removed. Or, after the mesh is generated in the second pitch over the entire surface of the semiconductor substrate 1, the mesh in the placement prohibiting region of the second dummy pattern $DP_2$ is removed, and, moreover, the mesh of the minimum allowable size or less is removed. Thereafter, the second dummy pattern $DP_2$ is placed in the mesh. Here, the second pitch is a pattern size (Lb+Sa) which is equal to the size Lb of a side of the second dummy pattern $DP_2$+the space size Sa, and, moreover, the second pitch of the second dummy pattern $DP_2$ is equal to 1/integer (N) of the first pitch of the first dummy pattern $DP_1$, namely equal to ½. Also, from the point of view of easier placement of the second dummy pattern $DP_2$, it is preferable to set the second pitch of the second dummy pattern $DP_2$ to 1/(an integer of the first pitch of the first dummy pattern $DP_1$).

In this embodiment 1, a plurality of first dummy patterns $DP_1$ are placed in the dummy region FA, which is isolated from the element forming region DA, and a plurality of dummy patterns $DP_2$ are placed in the dummy region FA near the element forming region DA, but the present invention is, of course, not limited to this embodiment 1. For example, a plurality of first dummy patterns $DP_1$ may be placed in the dummy region FA near the element forming region DA and a plurality of second dummy patterns $DP_2$ may be placed in the dummy region FA far from the element forming region DA. Otherwise, a plurality of dummy patterns $DP_1$ may be placed almost over the entire surface of the dummy region FA and a plurality of second dummy patterns $DP_2$ may also be placed among the adjacent first dummy patterns $DP_1$ where the second pitch is generated.

Moreover, in the embodiment 1, examples of the CMOS-FETs $C_1$, $C_2$, $C_3$ are shown as semiconductor elements formed in the element forming region DA, but these semiconductor elements may be replaced by other semiconductor elements, for example, a Bi-CMOS transistor.

As explained above, according to the embodiment 1, since the first dummy patterns $DP_1$ and second dummy patterns $DP_2$ can be placed in the region up to the boundary BL between the element forming region DA and dummy region FA, the flatness of the surface of the silicon oxide film 3 embedded within the isolation grooves 2, 2a can be improved over the entire region of the dummy region FA.

Moreover, the number of second dummy patterns $DP_2$ of relatively smaller area can be reduced by occupying a relatively wider region of the dummy region FA with the first dummy patterns $DP_1$ of relatively wider area, and, thereby, increase of the data amount of the mask can also be controlled. Moreover, the first dummy pattern $DP_1$ and second dummy pattern $DP_2$ can be expressed with the least data of the origin coordinate and XY coordinate by setting the shape of the first dummy pattern $DP_1$ and second dummy pattern $DP_2$. Accordingly, an increase of the coordinate amount for generating a mask can be controlled, and, thereby, an increase of the arithmetic processing time of the computer and time for drawing a pattern on the mask substrate can also be controlled.

Next, an example of the method of manufacturing a logic integrated circuit device of the embodiment 1 will be explained, following the process sequence with reference to FIG. 6 to FIG. 16.

Figure 6:
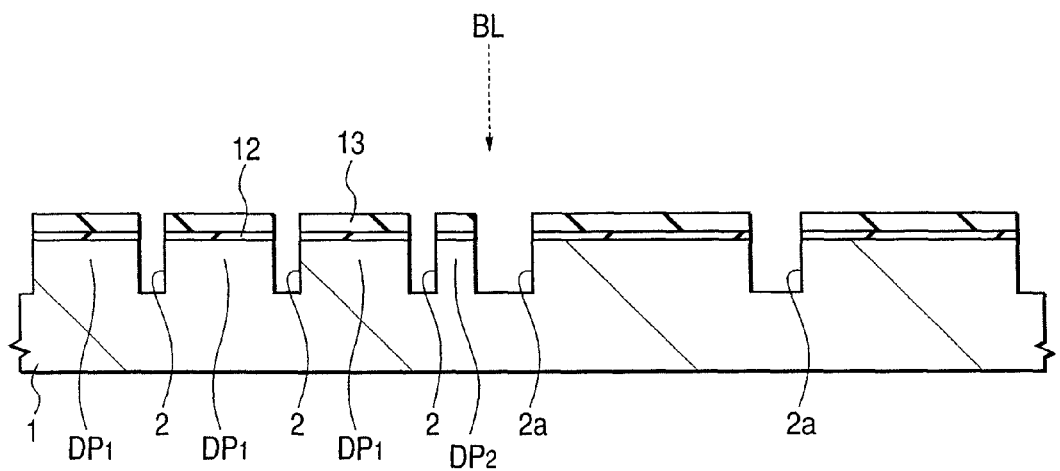
FIG. 6 is a cross-sectional view of a portion of a semiconductor substrate in a step of the process sequence of a method of manufacturing a logic integrated circuit device as an embodiment 1 of the present invention.

First, as shown in FIG. 6, a semiconductor substrate 1, for example, consisting of a p-type single crystal silicon, is prepared. Next, this semiconductor substrate 1 is thermally oxidized, and a thin silicon oxide film 12 is formed on the surface thereof to a thickness as thin as about 10 nm. Thereafter, a silicon nitride film 13 is deposited to a thickness of about 120 to 200 nm using the CVD method on the upper layer, and the silicon nitride film 13, silicon oxide film 12 and semiconductor substrate 1 are sequentially dry-etched using a resist pattern as a mask in order to form the isolation grooves 2, 2a to a depth of about 0.3 to 0.4 µm on the semiconductor substrate 1. In the dummy region FA, the first dummy pattern $DP_1$ and second dummy pattern $DP_2$ are provided to avoid the possibility that the entire region becomes an isolation groove.

Figure 7:
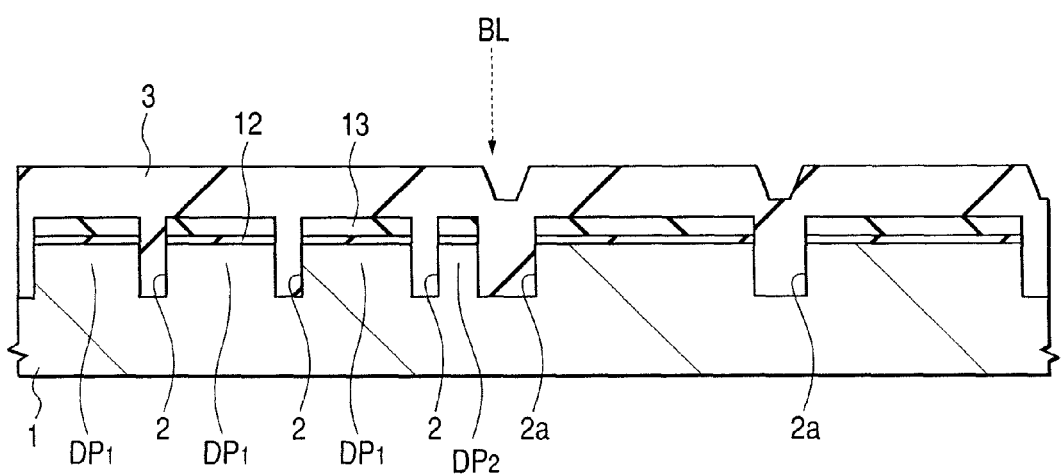
FIG. 7 is a cross-sectional view of a portion of a semiconductor substrate in a following step in the process sequence of a method of manufacturing a logic integrated circuit device as an embodiment 1 of the present invention.

Next, with a view toward cleaning the interface condition of the internal wall of the isolation grooves 2, 2a, the semiconductor substrate 1 is subjected to a thermal oxidation process to form, although not shown, a silicon oxide film as thin as about 10 to 30 nm on the exposed surface of the semiconductor substrate 1. Subsequently, as shown in FIG. 7, a silicon oxide film 3 is deposited using the CVD method or plasma CVD method on the semiconductor substrate 1. The film thickness of this silicon oxide film 3 is, for example, about 600 to 700 nm, and this silicon oxide film 3 is formed to have a profile such that the surface of the silicon oxide film 3, embedded in the relatively large isolation groove 2a so as to be easily formed at the boundary BL or in the element forming region DA, becomes higher than the surface of the silicon nitride film 13

Figure 8:
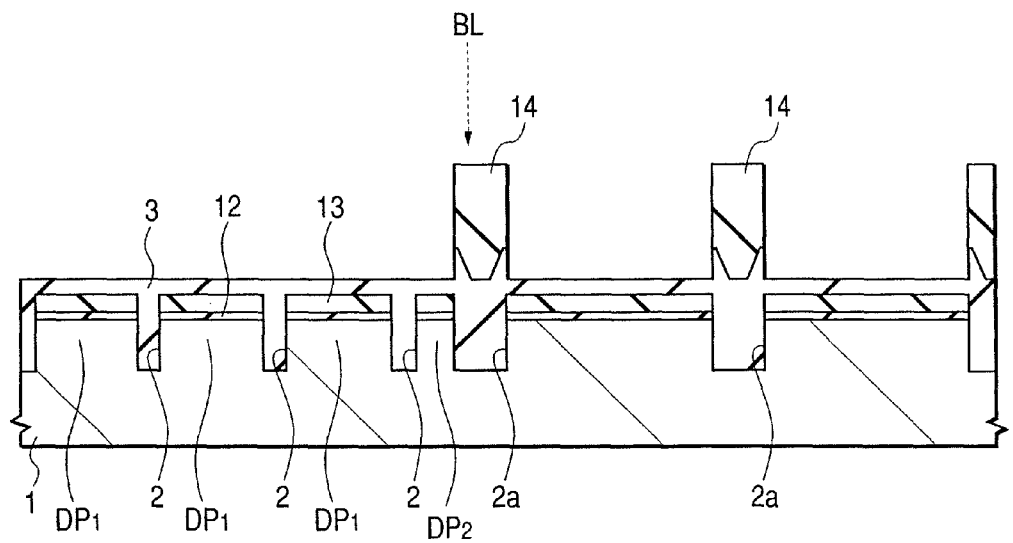
FIG. 8 is a cross-sectional view of a portion of a semiconductor substrate in a following step in the process sequence of a method of manufacturing a logic integrated circuit device as an embodiment 1 of the present invention.

Next, a mask in the form of an inverted mask of the isolation groove 2 is prepared. On this mask, only the pattern of the relative large isolation grooves 2a, which is to be easily formed in the boundary BL or element forming region DA in the inverted pattern, is depicted, and the pattern smaller than the particular size, for example, of 0.6 µm is removed. Using this mask, a resist pattern 14 is formed on the silicon oxide film 3, and the silicon oxide film 3 is removed by an etching process in the amount of about ½ (for example, about 300 nm) of the film thickness using the resist pattern 14 as a mask, as shown in FIG. 8. Thereby, in the subsequent CMP process, the flatness of the surface of the silicon oxide film 3 embedded in the relatively large isolation grooves 2a to be formed easily at the boundary BL or element forming region DA can be improved. Here, a horn-shaped projection is formed from what remains of the silicon oxide film 3 under the resist pattern 14, but this projection is polished in the subsequent CMP process.

Figure 9:
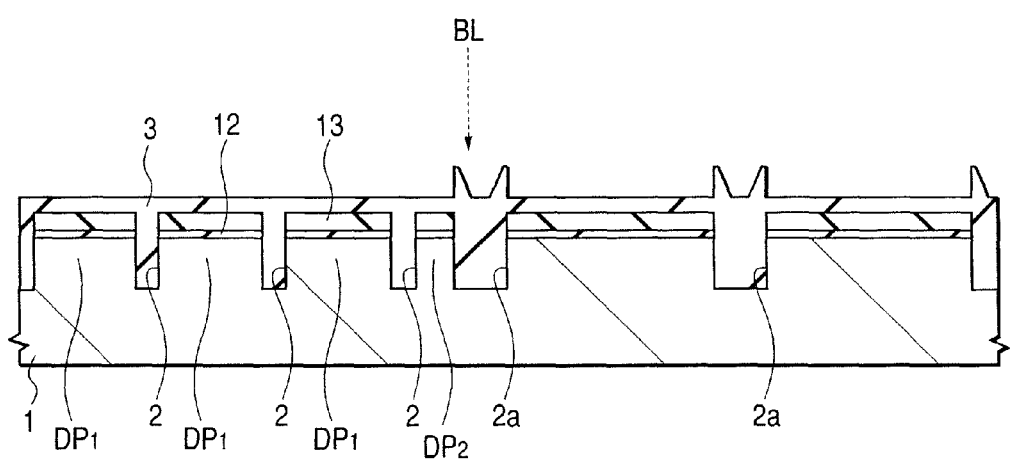
FIG. 9 is a cross-sectional view of a portion of a semiconductor substrate in a following step in the process sequence of a method manufacturing a logic integrated circuit device as an embodiment 1 of the present invention.
Figure 10:
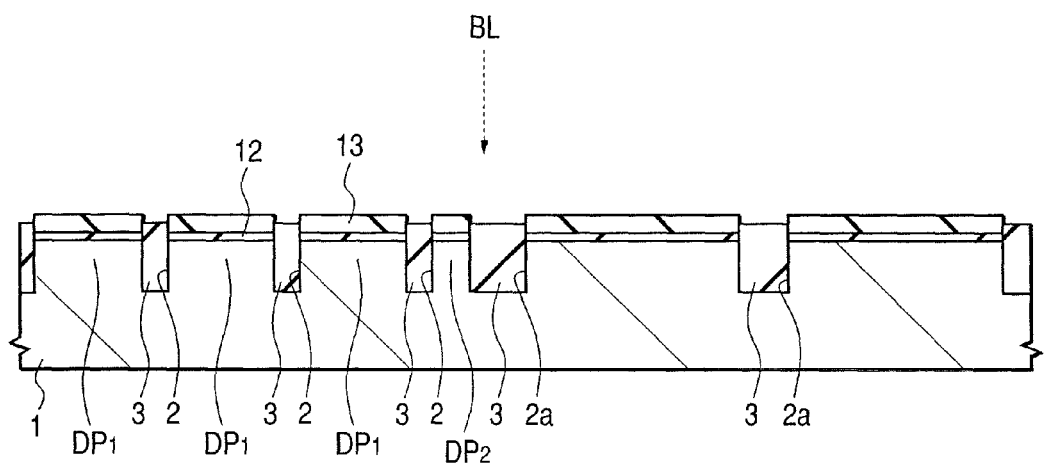
FIG. 10 is a cross-sectional view of a portion of a semiconductor substrate in a following step in the process sequence of a method of manufacturing a logic integrated circuit device as an embodiment 1 of the present invention.
Figure 11:
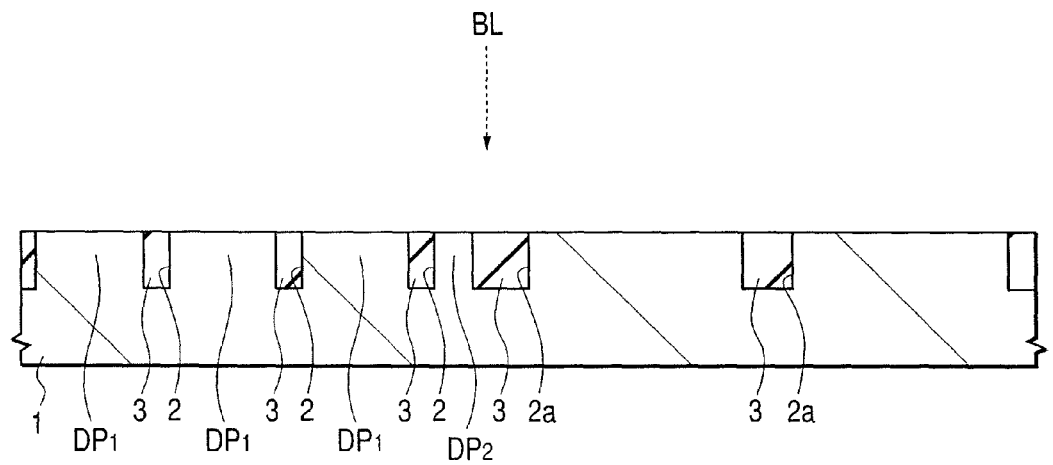
FIG. 11 is a cross-sectional view of a portion of a semiconductor substrate in a following step in the process sequence of a method of manufacturing a logic integrated circuit device as an embodiment 1 of the present invention.

Next, after the resist pattern 14 is removed, as shown in FIG. 9, the silicon oxide film 3 is polished using the CMP method, as shown in FIG. 10, leaving the silicon oxide film 3 within the isolation grooves 2, 2a. In this case, the silicon oxide film 12 functions as a stopper layer for the polishing to protect this film from the scraping by utilizing the polishing rates of the silicon nitride film 13 and silicon oxide film 3. Scraping of the silicon nitride film 13 is controlled, for example, to about 60 nm. Thereafter, the silicon oxide film 3 embedded in the isolation grooves 2 is densified (tightened using a burning process) by conducting heat treatment at a temperature of about 1000EC. Next, as shown in FIG. 11, the silicon nitride film 13 is removed using a wet etching process with hot phosphoric acid, and thereafter the silicon oxide film 12, as the underlayer, is then removed.

Figure 12:
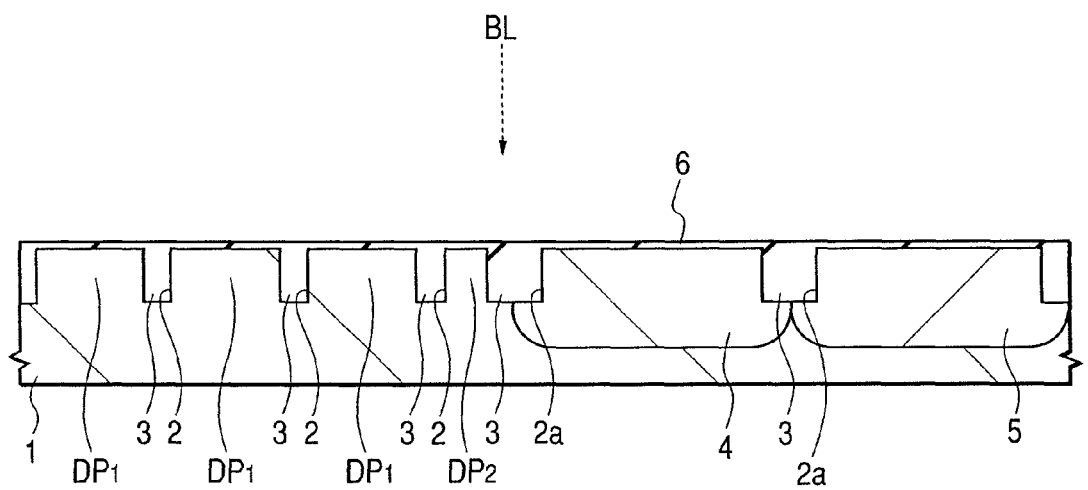
FIG. 12 is a cross-sectional view of a portion of a semiconductor substrate in a following step in the process sequence of a method of manufacturing a logic integrated circuit device as an embodiment 1 of the present invention.

Next, as shown in FIG. 12, a p-type impurity, for example, boron (B), is ion-injected to form the p-type well 4 in the n-channel MISFET forming region of the semiconductor substrate 1, and an n-type impurity, for example, phosphorus (P), is ion-injected to form the n-type well 5 in the p-channel MISFET forming region. In addition, although not shown in the figure, an impurity is ion-injected to the channel region. Thereafter, the semiconductor substrate 1 is thermally oxidized to form a gate insulation film 6 on the surface of semiconductor substrate 1 to a thickness, for example, of about 2 nm.

Figure 13:
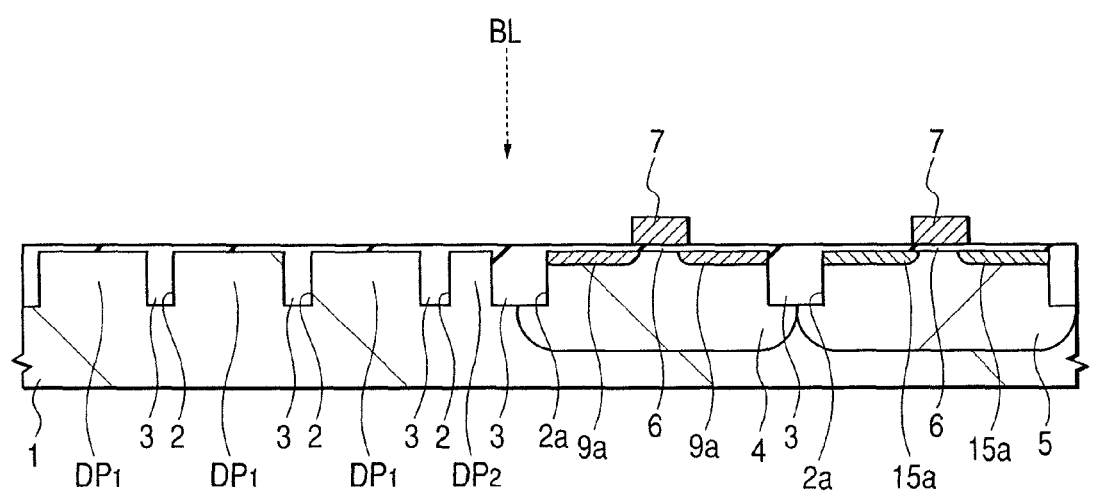
FIG. 13 is a cross-sectional view of a portion of a semiconductor substrate in a following step in the process sequence of a method of manufacturing a logic integrated circuit device as an embodiment 1 of the present invention.

Next, as shown in FIG. 13, a polycrystalline silicon film is deposited on the semiconductor substrate 1 using the CVD method, and, thereafter, the polycrystalline silicon film is etched using a resist pattern as a mask to form the gate electrodes 7 of the n-channel MISFET and p-channel MISFET. Subsequently, the semiconductor substrate 1 is subjected to a dry oxidation process at about 800□C.

Next, after the n-type well 5 is covered with a resist film, an n-type impurity, for example, arsenic (As), is ion-injected to the p-type well 4 using the gate electrode 7 of the n-channel MISFET as a mask to form the source and drain expanding regions 9a of the n-channel MISFET. Similarly, after the p-type well 4 is covered with a resist film, a p-type impurity, for example, boron fluoride ($BF_2$), is ion-injected to the n-type well 5 using the gate electrode 7 of the p-channel MISFET as a mask to form the source and drain expanding regions 15a of the p-channel MISFET.

Figure 14:
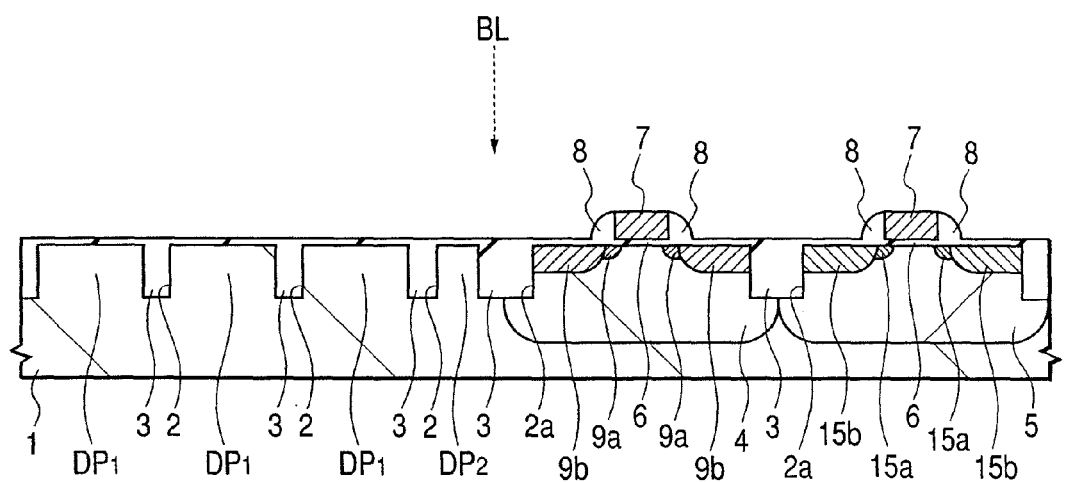
FIG. 14 is a cross-sectional view of a portion of a semiconductor substrate in a following step in the process sequence of a method of manufacturing a logic integrated circuit device as an embodiment 1 of the present invention.

Next, as shown in FIG. 14, after an insulation film, for example, a silicon oxide film or silicon nitride film, is deposited on the semiconductor substrate 1, this insulation film is anisotropically etched using RIE (Reactive Ion Etching) and a side wall spacer 8 consisting of an insulation film is formed to the respective side walls of the gate electrodes 7 of the n-channel MISFET and p-channel MISFET.

Next, after the n-type well 5 is covered with a resist film, an n-type impurity, for example, arsenic, is ion-injected to the p-type well 4 using the gate electrode 7 of the n-channel MISFET and the side wall spacer 8 as a mask in order to form the source and drain expanding regions 9b of the n-channel MISFET. In the same manner, after the p-type well 4 is covered with a resist film, a p-type impurity, for example, boron fluoride, is ion-injected to the n-type well 5 using the gate electrode 7 of p-channel MISFET as a mask in order to form the source and drain expanding region 15b of the p-channel MISFET.

Figure 15:
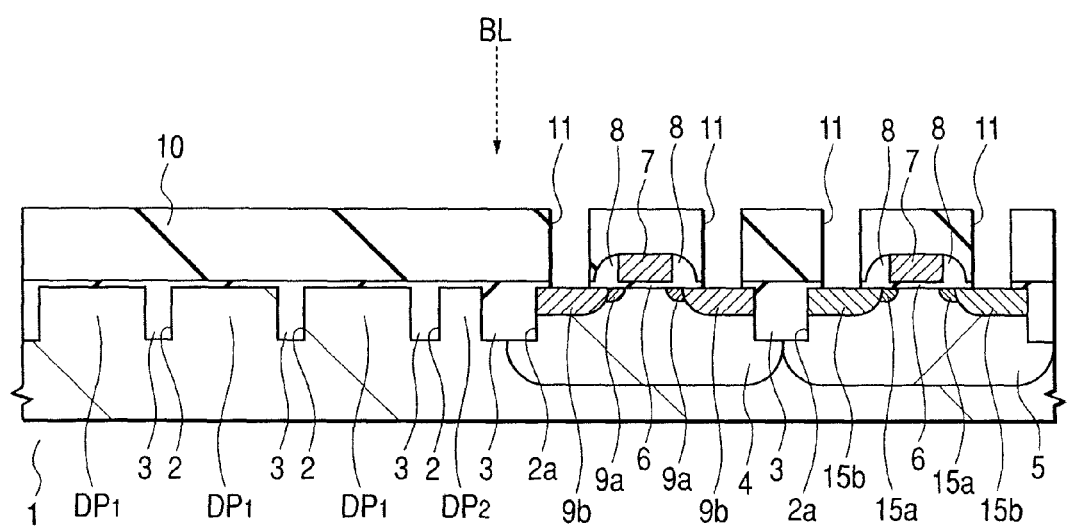
FIG. 15 is a cross-sectional view of a portion of a semiconductor substrate in a following step in the process sequence of a method of manufacturing a logic integrated circuit device as an embodiment 1 of the present invention.

Subsequently, as shown in FIG. 15, an interlayer insulation film 10, structured, for example, of a silicon oxide film, is formed on the semiconductor substrate 1. Thereafter, the surface of this interlayer insulation film 10 is flattened using the etch back method or CMP method. Then, the interlayer insulation film 10 is etched using a resist pattern as a mask to form a contact hole 11 reaching the source and drain expanding regions 9b of the n-channel MISFET and the source and drain expanding regions 15b of the p-channel MISFET. Although not shown in the figure, contact holes reaching the gate electrodes 7 of the n-channel MISFET and p-channel MISFET are also formed simultaneously.

Figure 16:
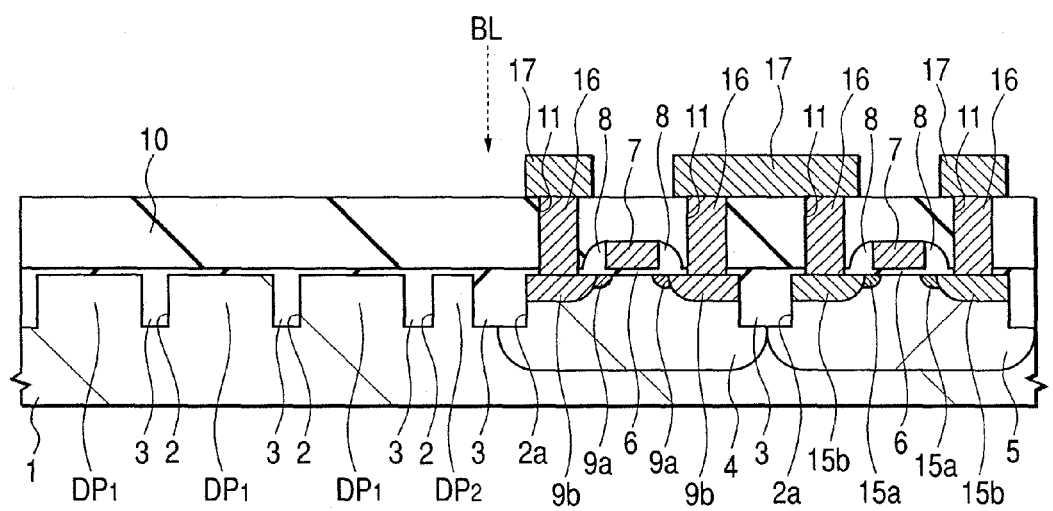
FIG. 16 is a cross-sectional view of a portion of a semiconductor substrate in a following step in the process sequence of a method of manufacturing a logic integrated circuit device as an embodiment 1 of the present invention.

Next, as shown in FIG. 16, a metal film, for example, a tungsten (W) film, is deposited on an upper layer of the interlayer insulation film 10, and a plug 16 is formed by embedding a metal film at the internal side of the contact hole 11 by flattening the surface of above metal film, for example, using the CMP method. Thereafter, the first layer wiring 17 is formed by etching the metal film deposited on the upper layer of the interlayer insulation film 10.

Thereafter, a wiring is formed as the upper layer of the first layer wiring 17, and, moreover, a surface protection film is formed to complete the logic integrated circuit device.
(Embodiment 2)

The embodiment 2 of the present invention is directed to another manufacturing method that can be used to form the structure of FIG. 1.

Figure 17:
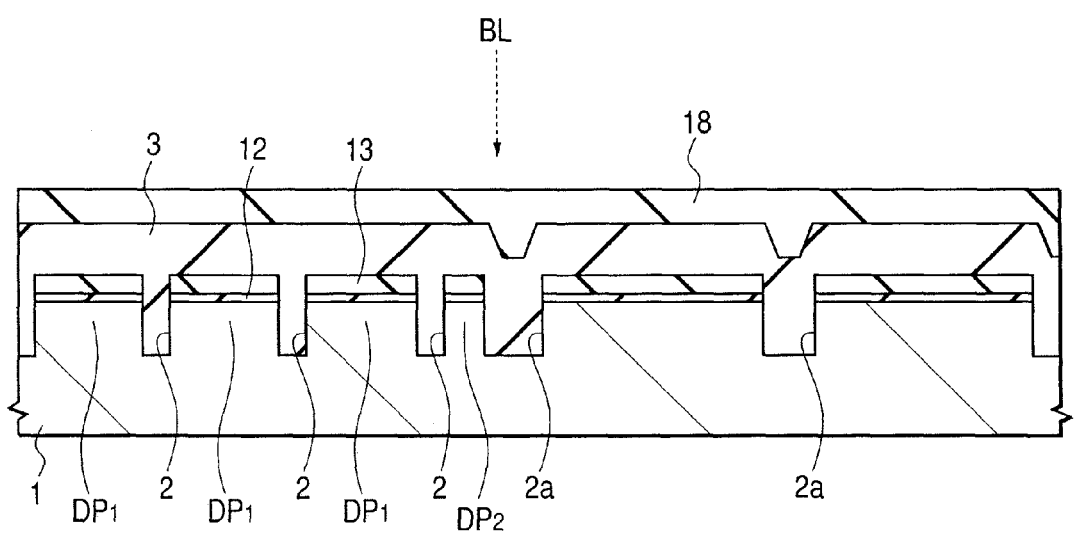
FIG. 17 is a cross-sectional view of a portion of a semiconductor substrate in a step in the process sequence of a method of manufacturing a logic integrated circuit device as an embodiment 2 of the present invention.
Figure 18:
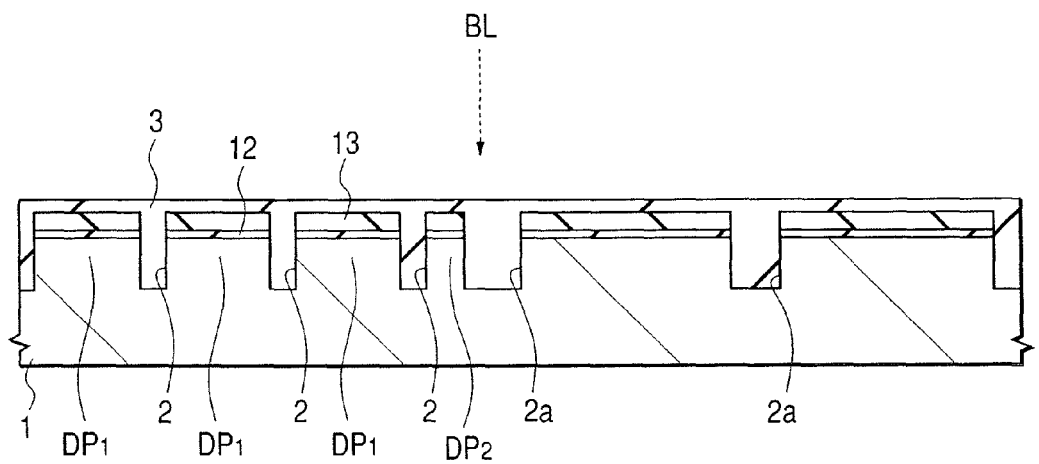
FIG. 18 is a cross-sectional view of a portion of a semiconductor substrate in a step in the process sequence of a method of manufacturing a logic integrated circuit device as an embodiment 2 of the present invention.

FIG. 17 and FIG. 18, which illustrate the embodiment 2, are cross-sectional views of a portion of a semiconductor substrate after completion of the manufacturing processes explained with reference to FIGS. 6 and 7.

In this embodiment, the isolation grooves 2, 2a are formed first to a depth of about 0.3 to 0.4 µm on the semiconductor substrate 1, and then the silicon oxide film 3 is deposited on the semiconductor substrate 1 using the CVD method or plasma CVD method.

Next, as shown in FIG. 17, a coated insulation film 18, for example, an SOG (Spin On Glass) film, is formed as the upper layer of the silicon oxide film 3. This coated insulation film 18 can be flattened at its surface even when a fine level-difference exists due to the fluidity of the film. Therefore, even if a recess is generated at the surface of the silicon oxide film 3, the surface of the coated insulation film 18 will be flat. Subsequently, the semiconductor substrate 1 is subjected to heat treatment to remove the solvent in the coated insulation film 18 and to form a dense substrate. This heat treatment temperature is ranged, in the case of annealing in a furnace, for example, from about 400 to 500□C or ranged, in the case of RTA (Rapid Thermal Annealing), for example, from about 700 to 800□C.

Next, as shown in FIG. 18, the coated insulation film 18 is etched using the etch back method. In this case, etching is performed until the coated insulation film 18 is removed almost completely, under the condition that the etching rate of the silicon oxide film 3 and the etching rate of the coated insulation film 18 are almost equal, with a view toward flattening the surface of the silicon oxide film 3. Thereafter, as shown in FIG. 10, the silicon oxide film 3 is left within the isolation grooves 2, 2a by polishing the silicon oxide film 3 on the silicon nitride film 2 using the CMP method.

Subsequently, the processes are identical to that explained with reference to FIG. 11 and subsequent figures relating to the embodiment 1 of the present invention.

As explained above, according to the embodiment 2, the surface of the silicon oxide film 3, that is embedded in the relatively large isolation groove 2a, which may easily be formed at the boundary BL or in the element forming region DA, can be flattened. Moreover, since the mask to which a resist pattern 14 used for flattening the surface of the silicon oxide film 3 in the embodiment 1 is no longer required, the manufacturing cost can be lowered in comparison with that of the embodiment 1.
(Embodiment 3)

The embodiment 3 is directed to another manufacturing method that can be used to form the structure of FIG. 1, and this embodiment will be explained with reference to FIG. 19 to FIG. 22.

Figure 19:
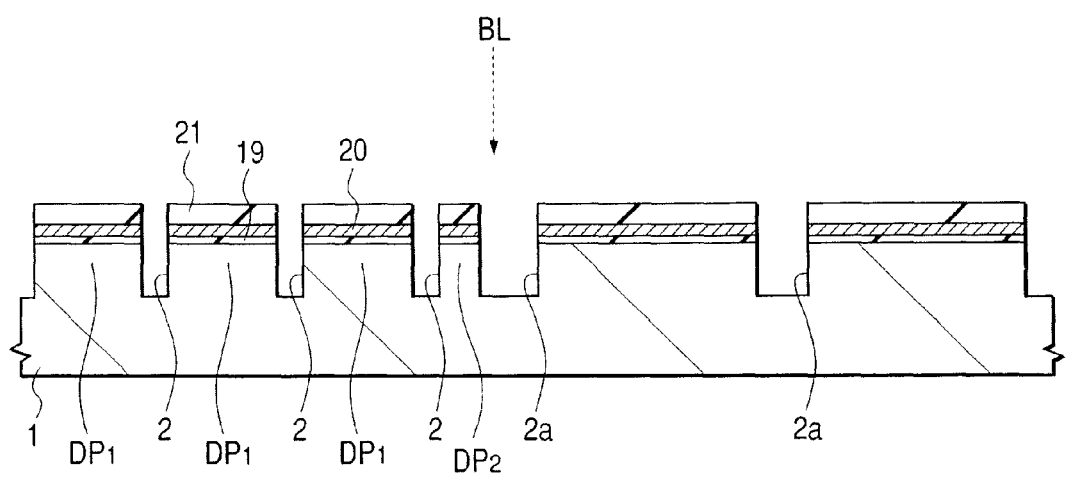
FIG. 19 is a cross-sectional view of a portion of a semiconductor substrate in a step in the process sequence of a method of manufacturing a logic integrated circuit device as an embodiment 3 of the present invention.

First, as shown in FIG. 19, a semiconductor substrate 1, consisting, for example, of a p-type single crystal silicon, is subjected to the thermal oxidation to form on the surface thereof a gate insulation film 19 consisting of a thin silicon oxide film having a thickness of about 2 to 3 nm. Next, a first silicon film 20 having a thickness of about 50 nm and a silicon nitride film having a thickness of about 120 to 200 nm are deposited sequentially as upper layers using the CVD method. Thereafter, the silicon nitride film 21, first silicon film 20 and gate insulation film 19 are sequentially dry-etched using a resist pattern as a mask. The first silicon film 20 is composed of a non-crystal silicon or polycrystalline silicon. Subsequently, after the resist pattern is removed, the isolation grooves 2, 2a are formed to a depth of about 0.3 to 0.4 μm on the semiconductor substrate 1 by dry-etching the semiconductor substrate 1 using the silicon nitride film 21 as a mask. In the dummy region FA, the first dummy pattern $DP_1$ and second dummy pattern $DP_2$ are provided so that the total region does not become an isolation groove.

Figure 20:
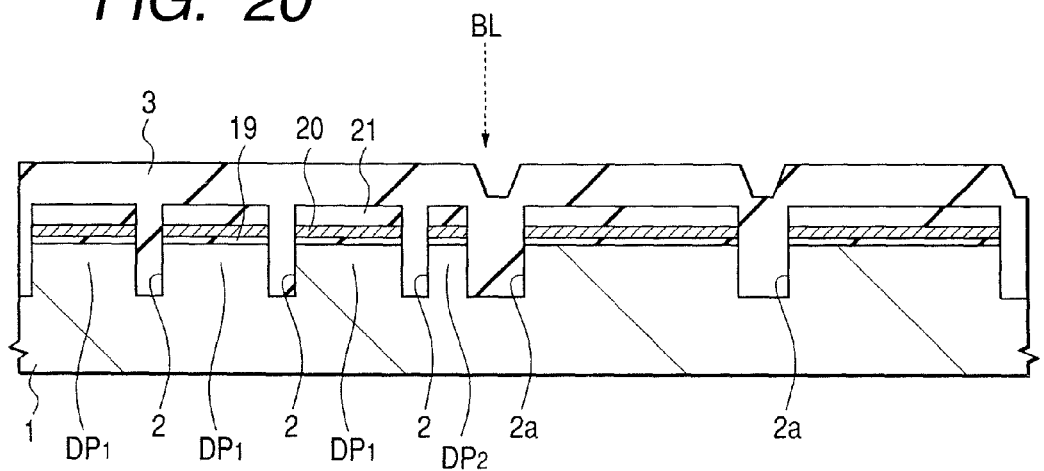
FIG. 20 is a cross-sectional view of a portion of a semiconductor substrate in a step in the process sequence of a method of manufacturing a logic integrated circuit device as an embodiment 3 of the present invention.
Figure 21:
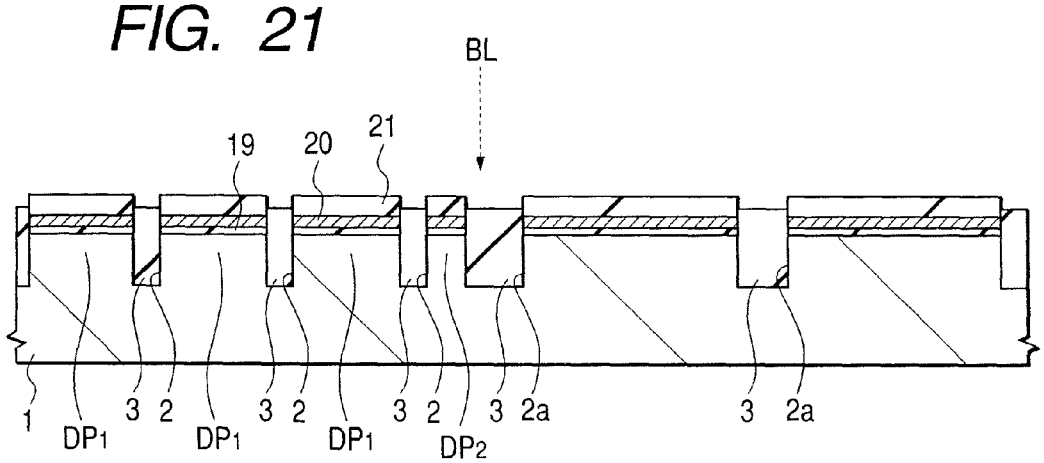
FIG. 21 is a cross-sectional view of a portion of a semiconductor substrate in a step in the process sequence of a method of manufacturing a logic integrated circuit device as an embodiment 3 of the present invention.

Next, although not shown in the figure, after a thinner silicon oxide film is formed to a thickness of about 10 to 30 nm on the exposed surface of the semiconductor substrate 1, the silicon oxide film 3 is deposited to a thickness of about 600 to 700 nm on the semiconductor substrate 1 using the CVD method or plasma CVD method, as shown in FIG. 20. Thereafter, as shown in FIG. 21, the silicon oxide film 3 is left in the isolation grooves 2, 2a in the same manner as explained with reference to FIG. 8 to FIG. 10 in the embodiment 1 explained above.

Figure 22:
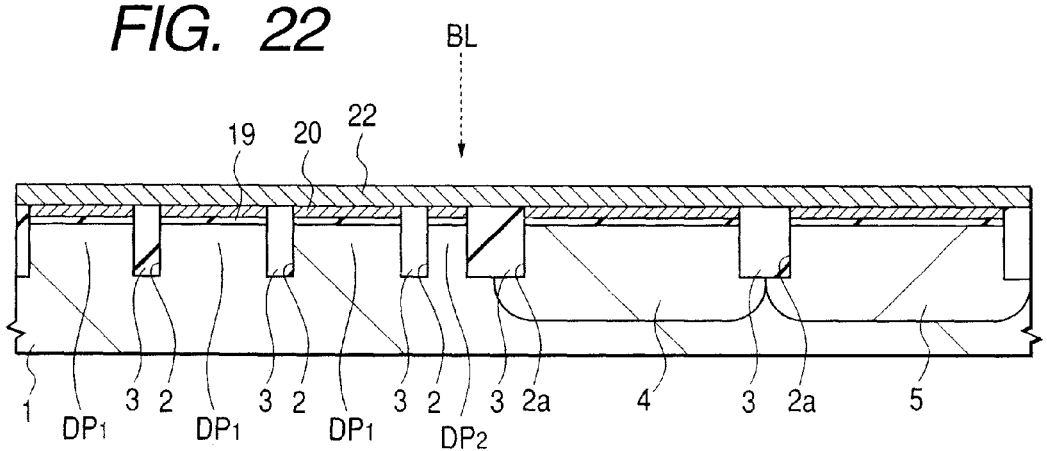
FIG. 22 is a cross-sectional view of a portion of a semiconductor substrate in a step in the process sequence of a method of manufacturing a logic integrated circuit device as an embodiment 3 of the present invention.

Next, as shown in FIG. 22, the silicon nitride film 21 is removed using wet-etching with hot phosphoric acid. In this case, the first silicon film 20 is not removed, but is used as a part of the gate electrodes of the CMOSFETs $C_1$, $C_2$, $C_3$. Thereafter, a p-type impurity is ion-implanted in order to form the p-type well 4 in the n-channel MISFET forming region of the semiconductor substrate 1, and an n-type impurity is also ion-implanted in order to form the n-type well 5 in the p-channel MISFET forming region. Moreover, although not shown in the figure, an impurity is ion-implanted to the channel region. Thereafter, a second silicon film 22 is formed on the semiconductor substrate 1 and the gate electrodes of the CMOSFETs $C_1$, $C_2$, $C_3$, with the laminated layer consisting of the first silicon film 20 and second silicon film 22.

The subsequent processes are identical to those explained with reference to FIG. 13 and successive figures relating to the embodiment 1, and, therefore, a repeated explanation thereof is omitted here.

As explained above, according to the embodiment 3, a kink generated in the drain current-gate voltage characteristic resulting from the roundness at the end portion of the isolation groove due to a fall of the silicon oxide film 3 embedded in the element isolation region IS can be prevented by using the first silicon film to form the element isolating region IS as a part of the gate electrodes of the CMOSFETs $C_1$, $C_2$, $C_3$.

(Embodiment 4)

An example of the placement of other dummy patterns, representing an embodiment 4, will be explained with reference to FIG. 23, FIG. 24(a) and FIG. 24(b).

Figure 23:
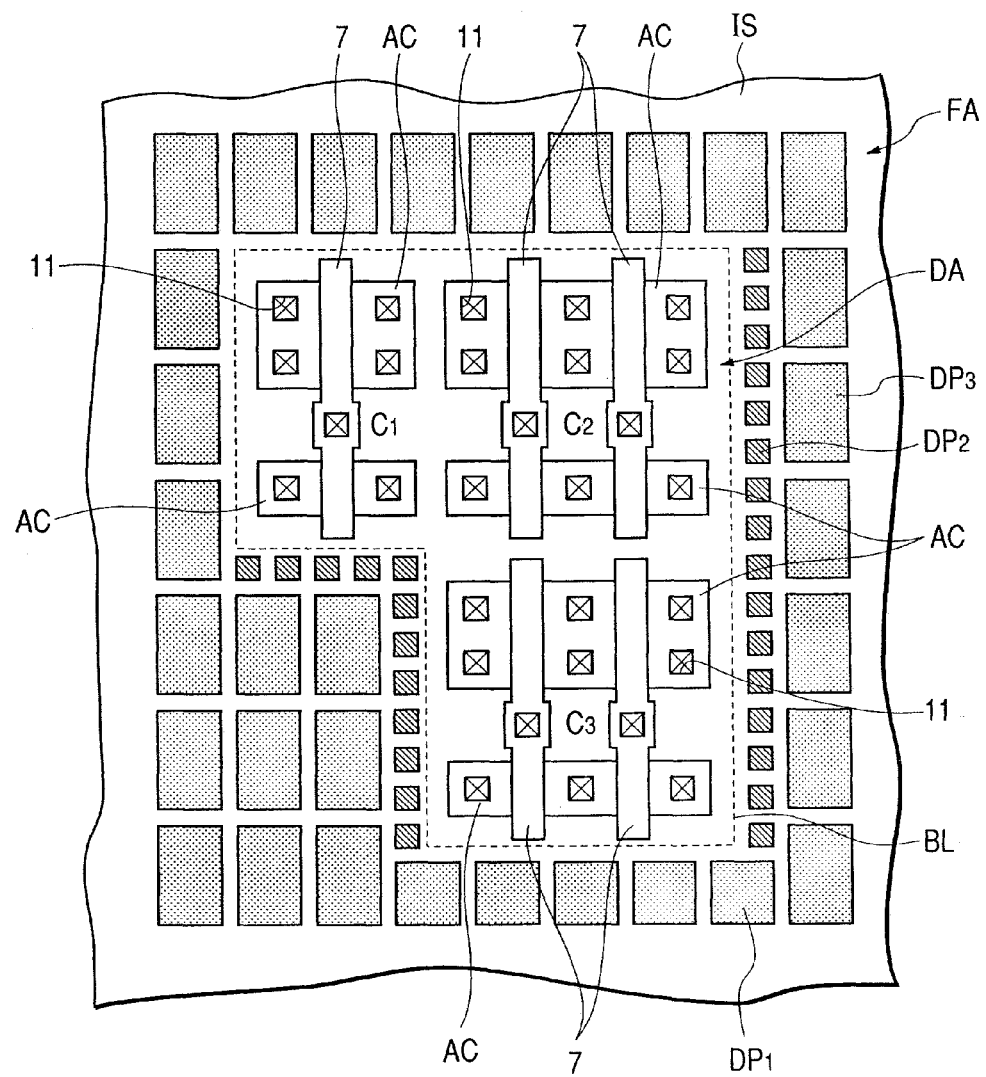
FIG. 23 is a plan view of a portion of another logic integrated circuit device representing an embodiment 4 of the present invention.
Figure 24A:
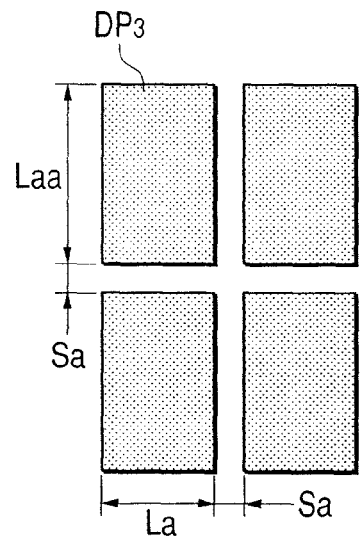
FIGS. 24(a) and 24(b) are diagrammatic plan views illustrating examples of a pitch and a size of dummy patterns.
Figure 24B:
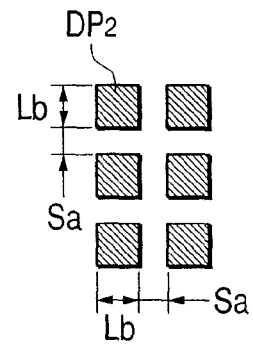

FIG. 23 is a plan view of a portion of a logic integrated circuit device, and FIGS. 24(a) and 24(b)a are illustrating a pitch and a size of the dummy pattern.

As shown in FIG. 23, like the embodiment 1, the area inside of the boundary BL, which is indicated in the figure with a broken line, is the element forming region DA where semiconductor elements are formed, and the CMOSFETs $C_1$, $C_2$, $C_3$ are formed in this region. Moreover, the area outside of the boundary BL is the dummy region FA where the semiconductor elements are not formed.

In the dummy region FA, rectangular third dummy patterns $DP_3$, which are larger than the first and second dummy patterns $PD_1$, $PD_2$, are also provided in addition to the first and second dummy patterns. Namely, three kinds of dummy patterns of different shapes and areas (first dummy pattern $DP_1$, second dummy pattern $DP_2$, third dummy pattern $DP_3$) are regularly placed in the dummy region FA. The third dummy pattern $DP_3$ is formed of a rectangular semiconductor island (indicated as stippled areas in FIG. 23) corresponding to the active region AC.

As shown in FIG. 24(a) and FIG. 24(b), the size Laa of the longer side and the size La of the short side of the third dummy pattern $DP_3$ are set larger than the size Lb of a side of the second dummy pattern $DP_2$, but the size of the space between adjacent third dummy patterns $DP_3$ is identical to the size Sa of the space between adjacent second dummy patterns $DP_2$.

Moreover, the size of a side of the third dummy pattern $DP_3$ is equal to an integer times the pattern size obtained by adding the space size Sa to the size Lb of a side of the second dummy pattern $DP_2$ both in the row and column directions and satisfies the relationships of Laa+Sa=N1(Lb+Sa), La+Sa=N2X (Lb+Sa) (N1, N2 is respectively integer 1 or larger (N1, N2☐1)). Thereby, since it is possible to regularly locate a plurality of first dummy patterns $DP_1$, second dummy patterns $DP_2$ and third dummy pattern $DP_3$ having different sizes in the dummy region FA, if the coordinate data at the time of generating a mask increases, an increase in the arithmetic processing time of the computer can be controlled.

Placement data of the first dummy pattern $DP_1$, second dummy pattern $DP_2$ and third dummy pattern $DP_3$ is generated in the same manner as the method of generating the placement data of the first dummy pattern $DP_1$ and second dummy pattern $DP_2$ explained with reference to the process diagram of FIG. 5 for the embodiment 1.

First, the placement prohibiting region (element forming region DA) of the first dummy pattern $DP_1$, second dummy pattern $DP_2$ and third dummy pattern $DP_3$ is obtained. Next, the third dummy pattern $DP_3$ is provided extensively to the greater part of the dummy region FA. For example, after the mesh is generated in the third pitch over the entire part of the semiconductor substrate 1, the mesh over the placement prohibiting region of the first dummy pattern $DP_1$, second dummy pattern $DP_2$ and third dummy pattern $DP_3$ is removed. Thereafter, the third dummy pattern $DP_3$ is placed to the mesh. Here, the third pitch has one side in the pattern size (Laa+Sa) obtained by adding the space size Sa to the size Laa of a longer side of the third dummy pattern $DP_3$ and also has the other side in the pattern size (La+Sa) obtained by adding the space size Sa to the size La of the shorter side of the third dummy pattern $DP_3$.

Next, the placement prohibiting region of the first dummy pattern $DP_1$ is obtained. The placement prohibiting region of the first dummy pattern $DP_1$ is obtained by adding the region where the third dummy patterns $DP_3$ are extensively provided to the placement prohibiting region of the first dummy pattern $DP_1$, second dummy pattern $DP_2$ and third dummy pattern $DP_3$. Next, the first dummy pattern $DP_1$ is provided extensively over the entire part of the dummy region FA. For example, after the mesh is generated in the first pitch over the entire part of the semiconductor substrate 1, the mesh over the placement prohibiting region of the first dummy pattern $DP_1$ is removed. Thereafter, the first dummy pattern $DP_1$ is placed in the mesh. Here, the first pitch is identical to the pattern size (La+Sa) obtained by adding the space size Sa to the size La of a side of the first dummy pattern $DP_1$.

Next, the placement prohibiting region of the second dummy pattern $DP_2$ is obtained. The placement prohibiting region of the second dummy pattern $DP_2$ is defined by adding the region where the first dummy pattern $DP_1$ and third dummy pattern $DP_3$ are provided extensively to the placement prohibiting region of the first dummy pattern $DP_1$, second dummy pattern $DP_2$ and third dummy pattern $DP_3$. Next, the second dummy patterns $DP_2$ are provided extensively. For example, after the mesh is generated at the second pitch over the entire part of the semiconductor substrate 1, the mesh over the placement prohibiting region of the second dummy pattern $DP_2$ is removed. Thereafter, the second dummy patterns $DP_2$ are placed in the mesh. Here, the second pitch is identical to the pattern size (Lb+Sa) obtained by adding the space size Sa to the size Lb of a side of the second dummy pattern $DP_2$.

As explained above, according to the embodiment 1, the dummy pattern is capable of selecting the desired shape without relation to the size of the area thereof, and it is also possible to combine three kinds or more of dummy patterns. Therefore, the degree of freedom for placement of dummy patterns can be increased, and the flatness at the surface of the silicon oxide film 3 embedded into the isolation grooves 2, 2a can also be improved. Moreover, an increase of mask data can be controlled by increasing the number of placements of the dummy patterns $DP_3$ of relatively large area.

(Embodiment 5)

Figure 25:
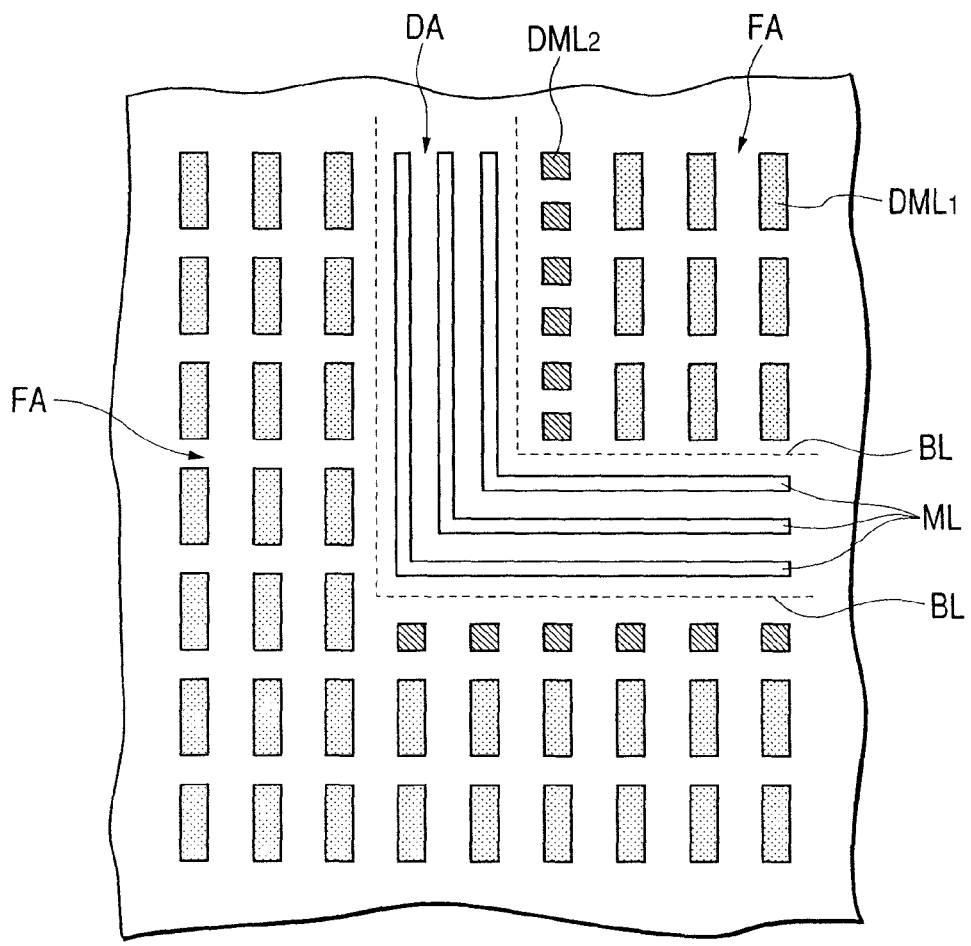
FIG. 25 is a plan view of a portion of dummy patterns of wiring representing an embodiment 5 of the present invention.
Figure 26A:
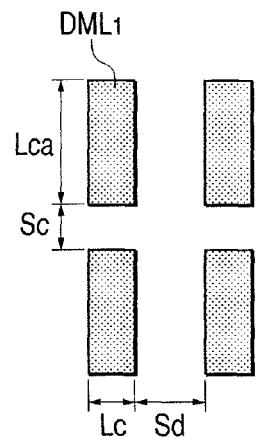
FIGS. 26(a) and 26(b) are diagrammatic plan views illustrating examples of a pitch and a size of dummy patterns of wiring.
Figure 26B:
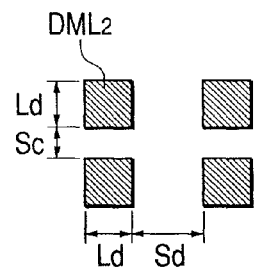
Figure 27:
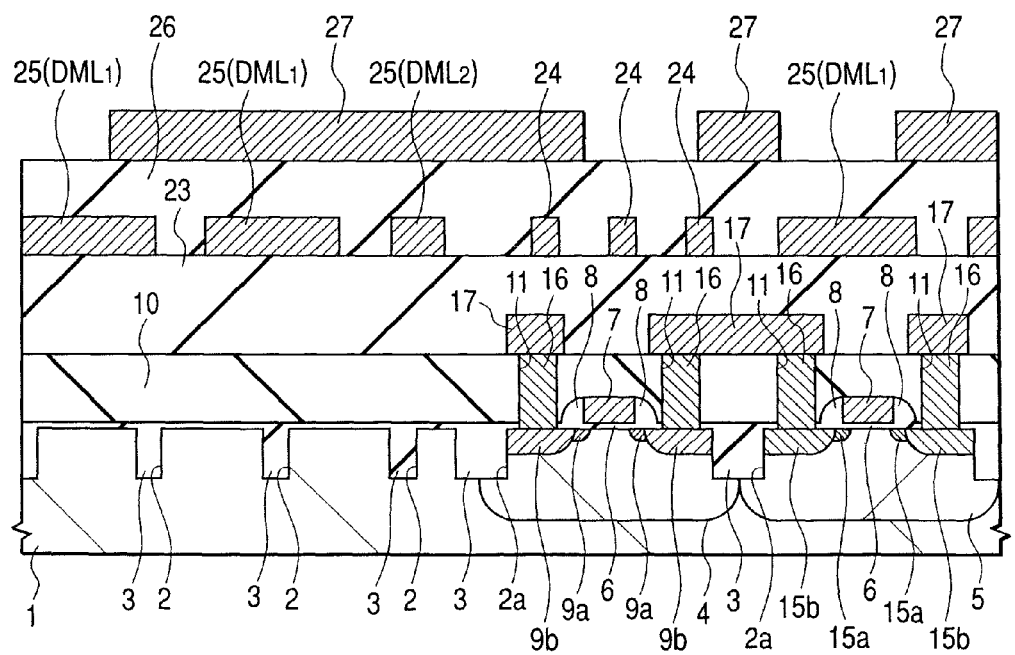
FIG. 27 is a cross-sectional view of a portion of a logic integrated circuit device using dummy patterns for the wiring according to an embodiment 5 of the present invention.
Figure 28:
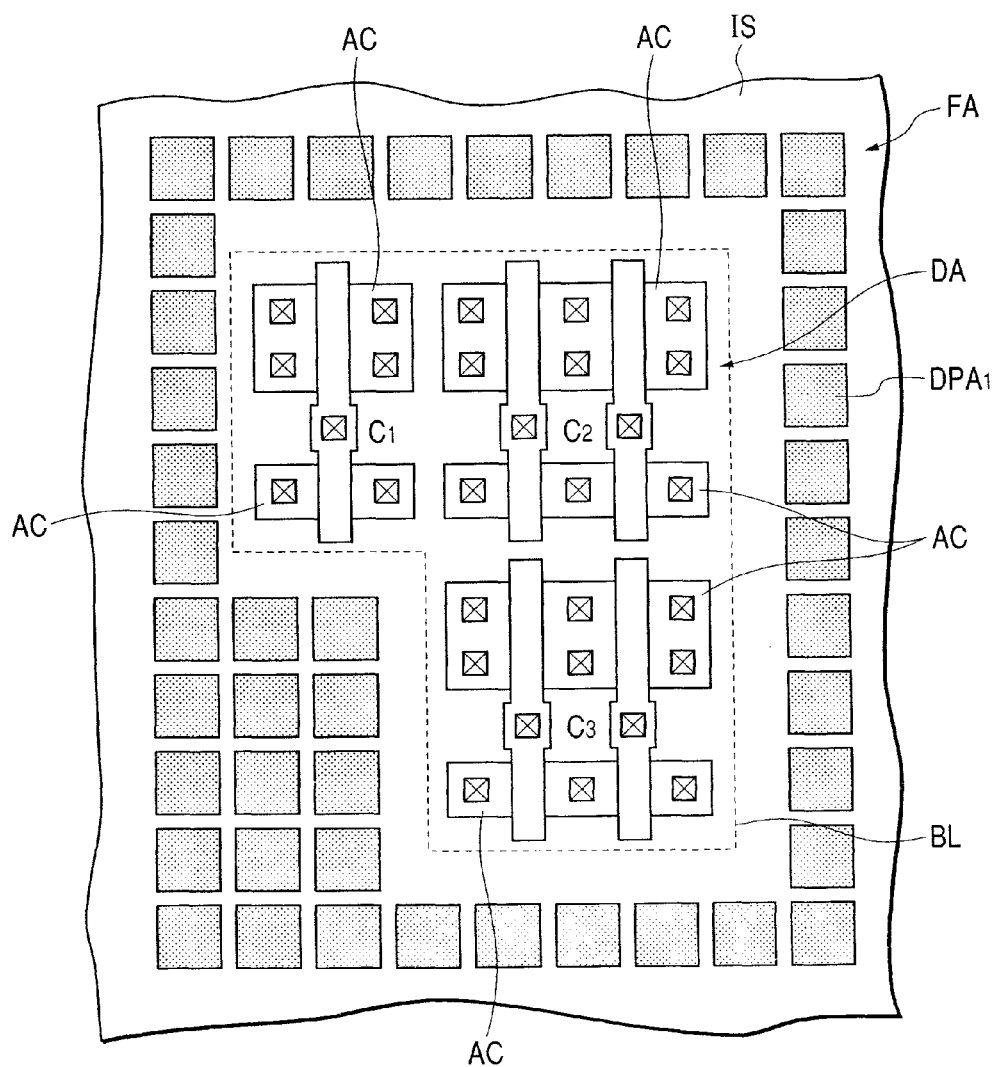
FIG. 28 is a plan view showing a first dummy pattern placement method discussed by the inventors of the present invention.
Figure 29:
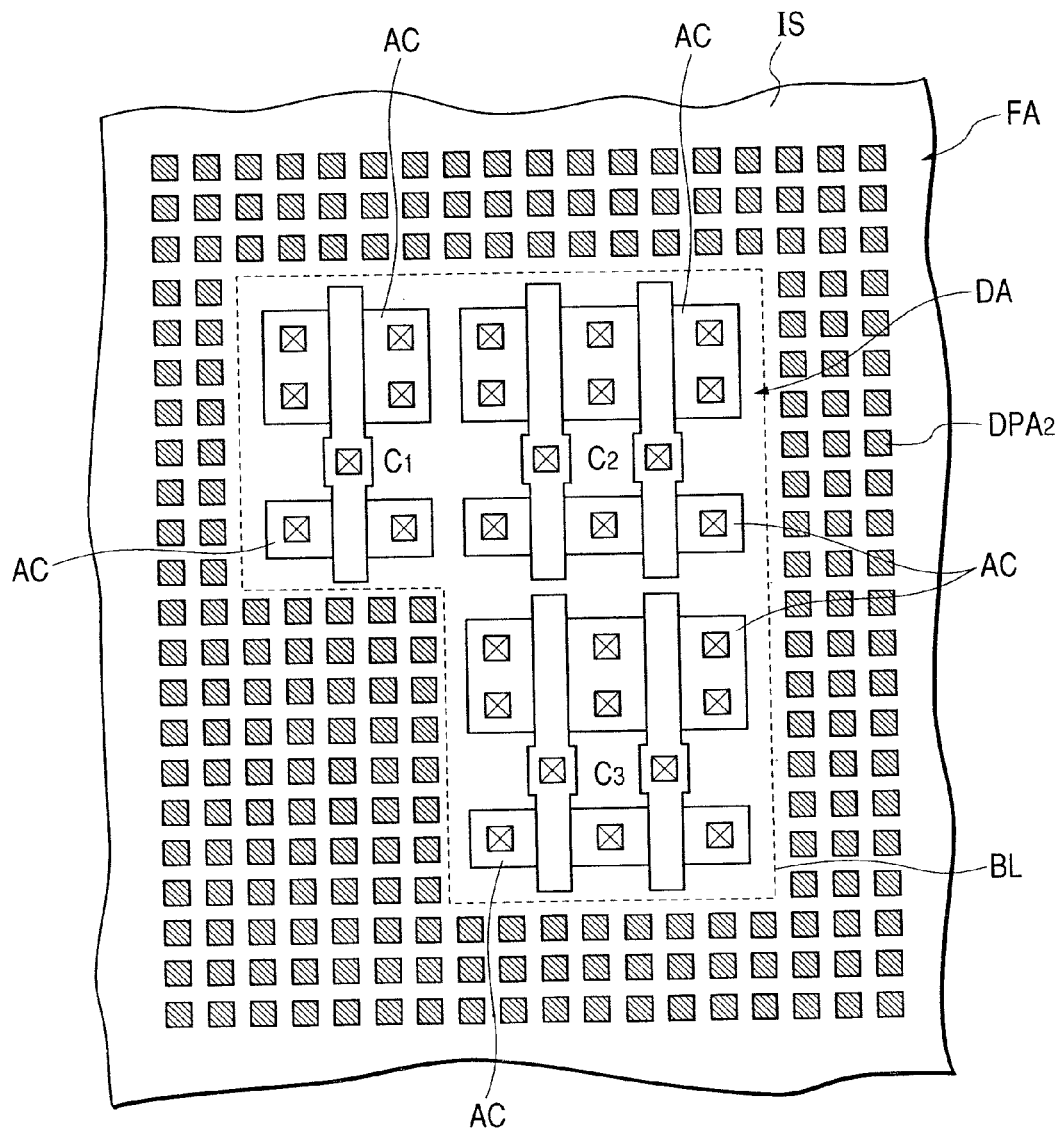
FIG. 29 is a plan view showing a second dummy pattern placement method discussed by the inventors of the present invention.

An example of the placement of dummy pattern of wiring will be explained with reference to FIG. 25 to FIG. 27 as an embodiment 5. FIG. 25 is a plan view of a portion of the dummy pattern of wiring. FIGS. 26(a) and 26(b) are diagrams illustrating a pitch and a size of the dummy patterns of wiring. FIG. 27 is a cross-sectional view showing an example of a logic integrated circuit device using a dummy pattern of wiring.

A dummy wiring system is one of the methods for overcoming disadvantages resulting from a level difference at the surface in the wiring process. This system is a method for extensively providing dummy patterns (conductive islands) consisting of the same material as that of the other wirings. This method is very effective for flattening the insulation film covering the wirings, and, moreover, for alleviation of a level difference at the surface. The embodiment 5 in which the present invention is adapted to this dummy wiring system will be explained hereunder.

As shown in FIG. 25, the area inside of the boundaries BL, which are indicated by broken lines is the element forming region DA, where wirings ML are formed, and the areas outside of the boundaries BL are dummy regions FA, where wirings ML are not formed.

In the dummy region FA, a plurality of first dummy wirings $DML_1$ of relatively wider area consisting of the same conductive layer as the wiring ML and a plurality of second dummy wirings $DML_2$ of relatively smaller area are placed regularly.

As shown in FIG. 26(a) and FIG. 26(b), the first dummy wiring $DML_1$, occupying a relatively wider region of the dummy region FA, is formed of a rectangular conductive island (indicated as relatively thinner stippled region in FIG. 25) having a size Lca of the longer side and a size Lc of the shorter side, and the second dummy wiring $DML_2$ is formed of a square conductive island (indicated as relatively thicker hatched region in FIG. 25) having a size Ld in a side in both row and column directions.

Moreover, the row-to-row space size among the adjacent first dummy wiring $DML_1$ and the row-to-row space size among the adjacent second dummy wiring $DML_2$ are set to the identical space size Sc, while the column-to-column space size among the adjacent first dummy wiring $DML_1$ and the column-to-column space size among the adjacent second dummy wiring $DML_2$ are set to the identical space size Sd. The widths Lca, Lc of the first dummy wiring $DML_1$ and the width Ld of the second dummy wiring $DML_2$ are set to the minimum line width or larger as required for the lithography technique and dry-etching technique, and the spaces Sc, Sd are set to the minimum space width or larger as required for the lithography technique and dry-etching technique.

Here, the pattern size identical to the size Lca of the longer side of the first dummy wiring $DML_1$+space size Sc is an integer times the pattern size identical to the size Ld of a side of the second dummy wiring $DML_2$+space size Sc and satisfies the relationship of Lca+Sc=N(Ld+Sc) (N is integer 1 or larger (N☐1)). In the same manner, the pattern size identical to the size the Lc of shorter side of the first dummy wiring $DML_1$+space size Sd is an integer times the pattern size identical to the size Lc of the shorter side of the first dummy wiring $DML_1$+space size Sd and satisfies the relationship of Lc+Sd=N(Ld+Sd) (N is integer 1 or larger (N☐1)).

FIG. 27 is a cross-sectional view of a portion of the semiconductor substrate showing an example of a logic integrated circuit device to which the dummy wiring system of the embodiment 5 is adapted.

For example, an interlayer insulation film 10 is formed to cover the CMOSFETs $C_1$, $C_2$, $C_3$ shown in FIG. 2 of the embodiment 1, and the first layer wiring 17 is formed on the interlayer insulation film 10. The surface of the interlayer insulation film 10 is flattened using the CMP method or etch-back method. Moreover, the first layer wiring 17 is covered with the interlayer insulation film 23. The surface of the interlayer insulation film 23 is flattened using the etch-back method or the like.

At the upper layer of the interlayer insulation film 23, the second layer wiring 24 and a dummy wiring 25 are formed. Here, as the dummy wiring 25, for example, the first dummy wiring $DML_1$ and second dummy wiring $DML_2$ are used. The second layer wiring 24 and dummy wiring 25 are composed of the same material and are formed in the same process. As a material thereof, for example, a metal material, such as aluminum (Al) or copper (Cu), may be used.

The second layer wiring 24 and dummy wiring 25 are covered with the interlayer insulation film 26. The interlayer insulation film 26 is, for example, a silicon oxide film, SOG (Spin On Glass) and lamination layer film consisting of a silicon oxide film, and the silicon oxide film described above may be a TEOS oxide film that is deposited using the plasma CVD method with TEOS (Tetra Ethyl Ortho Silicate: $Si(OC_2H_5)_4$) and ozone ($O_3$) as the source gas. The surface of the interlayer insulation film 26 is polished using the CMP method, and this surface is also flattened by utilizing the dummy wiring 25 (first dummy wiring $DML_1$, second dummy wiring $DML_2$).

Moreover, the third layer wiring 27 is also formed as the upper layer of the interlayer insulation film 26 to form, although not shown in the figure, a passivation film as the upper-most insulation film.

Here, in this embodiment 5, the dummy wiring 25 is laid in the process to form the second layer wiring 24, but the dummy wiring may also be provided in the process to form the first layer wiring 17 or the third layer wiring 27. Moreover, even when the upper layer wiring is laid on the third layer wiring 27, the dummy wiring can also be provided in the process to form these wirings.

As explained above, according to the embodiment 5, since the dummy wiring 25 can be placed over the entire region of the dummy region FA by utilizing the first dummy wiring $DML_1$ of relatively large area and the second dummy wiring $DML_2$ of relatively small area, the flatness of the surface of the interlayer insulation film 26 formed as the upper layer of the second layer wiring 24 can be improved. Moreover, since the first dummy wiring $DML_1$ of relatively large area occupies a relatively wider region of the dummy region FA, the number of placements of the second dummy wiring $DML_2$ of relatively small area can be relatively reduced, and, thereby, an increase in the mask data amount can be controlled.

The preferred embodiments of the present invention have been explained above, but the present invention is not restricted to these embodiments, and so various changes and modifications are possible within the scope of the claims thereof.

For example, in above embodiments, square and rectangular shapes are selected as the shapes of a dummy pattern, but the shape of a dummy pattern is not restricted thereto, and a triangular shape, trapezoidal shape, circular shape or other polygonal shape may also be selected for the dummy pattern.

The effects of the typical aspects and features of the present invention will be briefly explained as follows.

According to the present invention, the flatness of a member surface embedded to a plurality of recesses can be improved by placing at least two dummy pattern groups therein.

Moreover, since a dummy pattern of relatively large area occupies a relative wider area of the dummy region, an increase in the time required for generation of a mask can be controlled by suppressing an increase in the coordinate data amount required for generation of a mask. Accordingly, the flatness of a member surface embedded in a plurality of recesses can be improved without increasing the time required for manufacturing the semiconductor device.

The invention claimed is:

1. A semiconductor device comprising:
    grooves formed in a semiconductor substrate such that the grooves define an active region, a plurality of first dummy regions and a plurality of second dummy regions;
    element isolation insulating films filled in the grooves;
    a semiconductor element formed in the active region;
    a first interlayer insulation film formed over the semiconductor element, the active region, the first dummy regions and the second dummy regions;
    a first wiring, a plurality of first dummy wirings and a plurality of second dummy wirings formed over the first interlayer insulation film, respectively; and
    a second interlayer insulation film formed over the first wiring, the first dummy wirings and the second dummy wirings,
    wherein the first wiring is electrically connected with the semiconductor elements,
    wherein the first dummy wirings and the second dummy wirings are not electrically connected with the semiconductor elements,
    wherein a planar size of each of the first dummy regions is larger than a planar size of each of the second dummy regions,
    wherein each of the first dummy regions is arranged with same pitch,
    wherein each of the second dummy regions is arranged with same pitch,
    wherein a planar size of each of the first dummy wirings is larger than a planar size of each of the second dummy wirings,
    wherein each of the first dummy wirings is arranged with same pitch,
    wherein each of the second dummy wirings is arranged with same pitch,
    wherein the second dummy wirings are arranged next to the first wiring, and between the first wiring and the first dummy wirings,
    wherein the pitch of the first dummy regions is larger than the pitch of the second dummy regions,
    wherein the pitch of the first dummy wirings is larger than the pitch of the second dummy wirings, and
    wherein, in planar view, the first and second dummy wirings are arranged over the first and second dummy regions.

2. The semiconductor device according to claim 1,
    wherein, in planar view, the first dummy wirings are arranged over the first dummy regions, and
    wherein, in planar view, the second dummy wirings are arranged over the second dummy regions.

3. The semiconductor device according to claim 1,
    wherein the first wiring, the first dummy wirings and the second dummy wirings are formed of a copper as a major component.

4. The semiconductor device according to claim 1,
    wherein the semiconductor element is a MOSFET.

5. The semiconductor device according to claim 2,
    wherein the first wiring, the first dummy wirings and the second dummy wirings are formed of a copper as a major component.

6. The semiconductor device according to claim 5,
    wherein the semiconductor element is a MOSFET.

7. The semiconductor device according to claim 5,
    wherein the semiconductor element is a MOSFET.

* * * * *